United States Patent
Feng et al.

(10) Patent No.: US 12,114,484 B2
(45) Date of Patent: Oct. 8, 2024

(54) BURIED BIT LINE STRUCTURE, MANUFACTURING METHOD THEREOF, AND SEMICONDUCTOR STRUCTURE

(71) Applicant: CHANGXIN MEMORY TECHNOLOGIES, INC., Hefei (CN)

(72) Inventors: Wei Feng, Hefei (CN); Jingwen Lu, Hefei (CN); Bingyu Zhu, Hefei (CN); Zhaopei Cui, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 318 days.

(21) Appl. No.: 17/650,702

(22) Filed: Feb. 11, 2022

(65) Prior Publication Data

US 2023/0032351 A1    Feb. 2, 2023

Related U.S. Application Data

(63) Continuation of application No. PCT/CN2021/116915, filed on Sep. 7, 2021.

(30) Foreign Application Priority Data

Jul. 29, 2021    (CN) .......................... 202110862614.0

(51) Int. Cl.
*H01L 27/108*    (2006.01)
*H10B 12/00*    (2023.01)

(52) U.S. Cl.
CPC ........... *H10B 12/482* (2023.02); *H10B 12/30* (2023.02)

(58) Field of Classification Search
CPC ...... H10B 12/482; H10B 12/30; H10B 12/34; H01L 21/764
See application file for complete search history.

(56) References Cited

U.S. PATENT DOCUMENTS

| 9,837,422 B2 | 12/2017 | Kim et al. |
| 2011/0101435 A1 | 5/2011 | Jung et al. |
| (Continued) |

FOREIGN PATENT DOCUMENTS

| CN | 103165539 B | 4/2017 |
| CN | 209216973 U | 8/2019 |
| (Continued) |

OTHER PUBLICATIONS

International Search Report cited in PCT/CN2021/116915 mailed Apr. 28, 2022, 10 pages.

*Primary Examiner* — Mohammed R Alam
(74) *Attorney, Agent, or Firm* — Syncoda LLC; Feng Ma

(57) ABSTRACT

The present disclosure provides a method of manufacturing a buried bit line structure and a buried bit line structure. The method of manufacturing a buried bit line structure includes: providing an initial structure, the initial structure including active region structures; forming an initial bit line trench, the initial bit line trench exposing the active region structure; forming a conductive structure, the conductive structure being located at the bottom of the initial bit line trench; forming a bit line contact structure, the bit line contact structure covering the conductive structure, and a top surface of the bit line contact structure being lower than a top surface of the active region structure; and forming an insulation structure, the insulation structure covering the bit line contact structure.

20 Claims, 27 Drawing Sheets

(56) References Cited

U.S. PATENT DOCUMENTS

2021/0035613 A1\* 2/2021 Park .................... H10B 12/485
2022/0139925 A1  5/2022 Su
2022/0173108 A1\* 6/2022 Lee ...................... H10B 12/34

FOREIGN PATENT DOCUMENTS

CN  112992775 A  6/2021
CN  113035872 A  6/2021

\* cited by examiner

BURIED BIT LINE STRUCTURE, MANUFACTURING METHOD THEREOF, AND SEMICONDUCTOR STRUCTURE

CROSS-REFERENCE TO RELATED APPLICATIONS

This is a continuation of International Application No. PCT/CN2021/116915, filed on Sep. 7, 2021, which claims the priority to Chinese Patent Application 202110862614.0, titled "BURIED BIT LINE STRUCTURE, MANUFACTURING METHOD THEREOF, AND SEMICONDUCTOR STRUCTURE" and filed on Jul. 29, 2021. The entire contents of International Application No. PCT/CN2021/116915 and Chinese Patent Application 202110862614.0 are incorporated herein by reference.

TECHNICAL FIELD

The present disclosure relates to, but is not limited to, a buried bit line structure, a manufacturing method thereof, and a semiconductor structure.

BACKGROUND

A dynamic random access memory (DRAM) has advantages of a small volume, high integration, and low power consumption, and a data read speed of the DRAM is faster than that of a read only memory (ROM).

With increasingly high integration, the DRAM becomes smaller and smaller. As a result, a bit line structure also becomes increasingly small. A process window of a bit line structure during manufacturing is reduced, and bit lines tend to tilt and collapse during the manufacturing process, affecting a structure yield.

SUMMARY

An overview of the subject matter detailed in the present disclosure is provided below, which is not intended to limit the protection scope of the claims.

The present disclosure provides a buried bit line structure, a manufacturing method thereof, and a semiconductor structure.

A first aspect of the present disclosure provides a method of manufacturing a buried bit line structure, including:
providing an initial structure, the initial structure including a base and a protective layer provided on the base, and the base including active region structures and a dielectric layer;
removing the protective layer, the active region structure, and the dielectric layer partially to form an initial bit line trench, the initial bit line trench exposing the active region structure;
forming a conductive structure, the conductive structure being located at a bottom of the initial bit line trench;
forming a bit line contact structure, the bit line contact structure covering the conductive structure, and a top surface of the bit line contact structure is lower than a top surface of the active region structure; and
forming an insulation structure, the insulation structure covering the bit line contact structure, and a top surface of the insulation structure is flush with a top surface of the protective layer.

A second aspect of the present disclosure provides a buried bit line structure, including:
a base, the base including active region structures and a dielectric layer, and a top surface of the active region structure is flush with a top surface of the dielectric layer;
a bit line trench, provided in the dielectric layer and the active region structure;
a conductive structure, the conductive structure covering a bottom surface of the bit line trench and being at a preset distance from the bottom surface of the bit line trench;
a bit line contact structure, the bit line contact structure covering the conductive structure, and a top surface of the bit line contact structure being lower than the top surface of the active region structure; and
an insulation structure, the insulation structure covering the bit line contact structure.

A third aspect of the present disclosure provides a semiconductor structure, and the semiconductor structure includes the buried bit line structure according to the second aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

Figure 1:
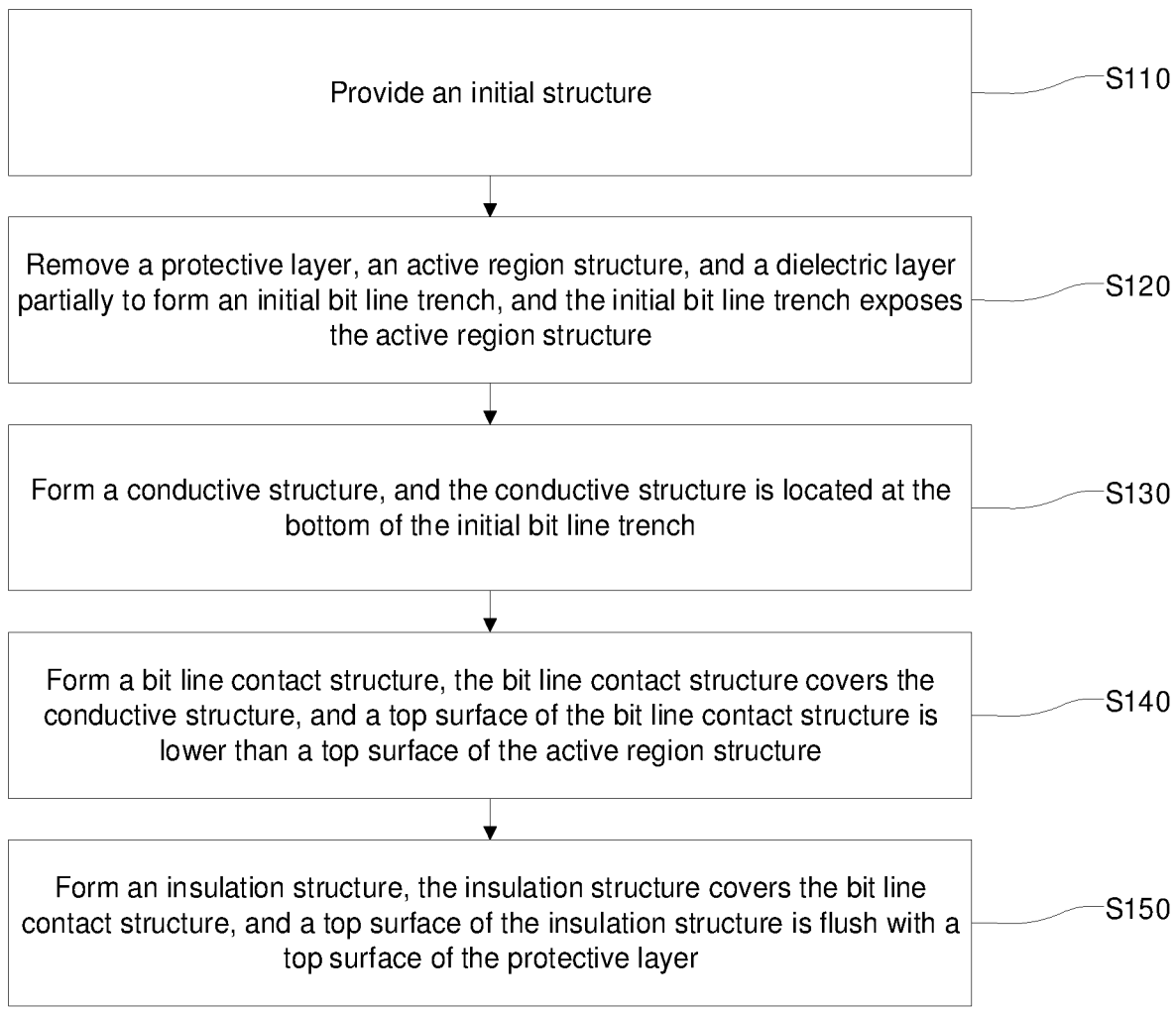
FIG. 1 is a flowchart of a method of manufacturing a buried bit line structure according to an exemplary embodiment.

REFERENCE NUMERALS 100. initial structure; 101. substrate; 102. first patterned mask; 103. first pattern; 104. second patterned mask; 105. second pattern; 110. base; 111. active region structure; 112. dielectric layer; 120. protective layer; 130. initial bit line trench; 140. shallow trench structure; 160. word line trench;
210. isolation structure; 220. barrier structure; 230. conductive structure; 231. initial conductive structure; 240. bit line contact structure; 241. polycrystalline silicon layer; 250. insulation structure;
300. buried word line; 310. word line metal; 320. insulation portion;
400. mask layer; 410. opening.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In an existing method of manufacturing a bit line structure, a bit line contact structure, a barrier metal layer, and a conductive metal layer are successively deposited and form a laminated structure, then the laminated structure is successively etched to form a linear bit line structure, and then a nitride layer—an oxide layer—a nitride layer are successively formed on a side wall of the bit line structure to protect the bit line structure.

However, as integration of a DRAM is increasingly high, a size of the bit line structure shrinks, and the bit line structure becomes thinner and thinner, which is easy to tilt and collapse during an etching process. In addition, etching may damage the bit line structure, causing damage to a bit line and affecting a product yield.

For this, an exemplary embodiment of the present disclosure provides a method of manufacturing a buried bit line structure. As shown in FIG. 1, FIG. 1 is a flowchart of a method of manufacturing a buried bit line structure according to an exemplary embodiment of the present disclosure. The method of manufacturing a buried bit line structure is described below.

The method of manufacturing a buried bit line structure in this embodiment includes:

S110: Provide an initial structure.

Figure 13:
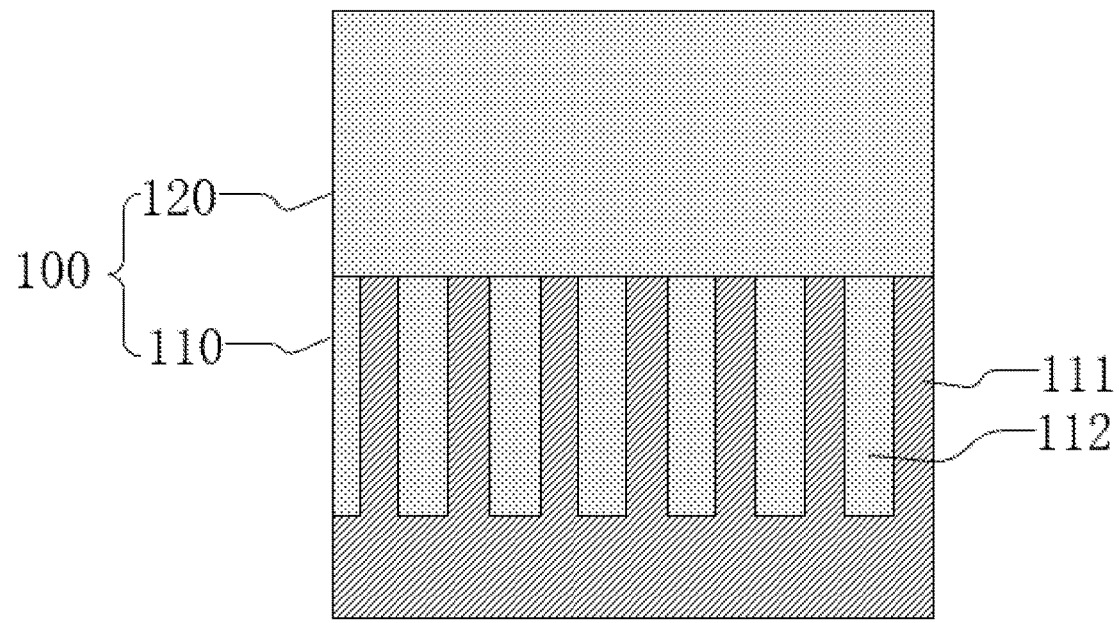
FIG. 13 is a schematic cross-sectional diagram of an initial structure provided in a method of manufacturing a buried bit line structure along an A-A section according to an exemplary embodiment.
Figure 14:
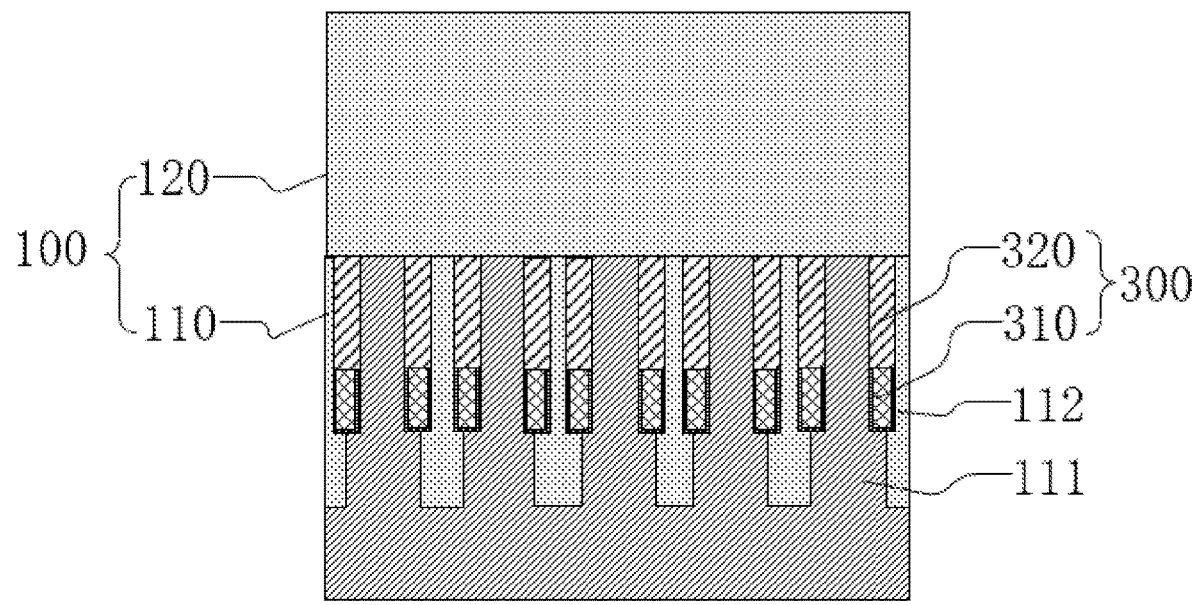
FIG. 14 is a schematic cross-sectional diagram of an initial structure provided in a method of manufacturing a buried bit line structure along a B-B section according to an exemplary embodiment.
Figure 15:
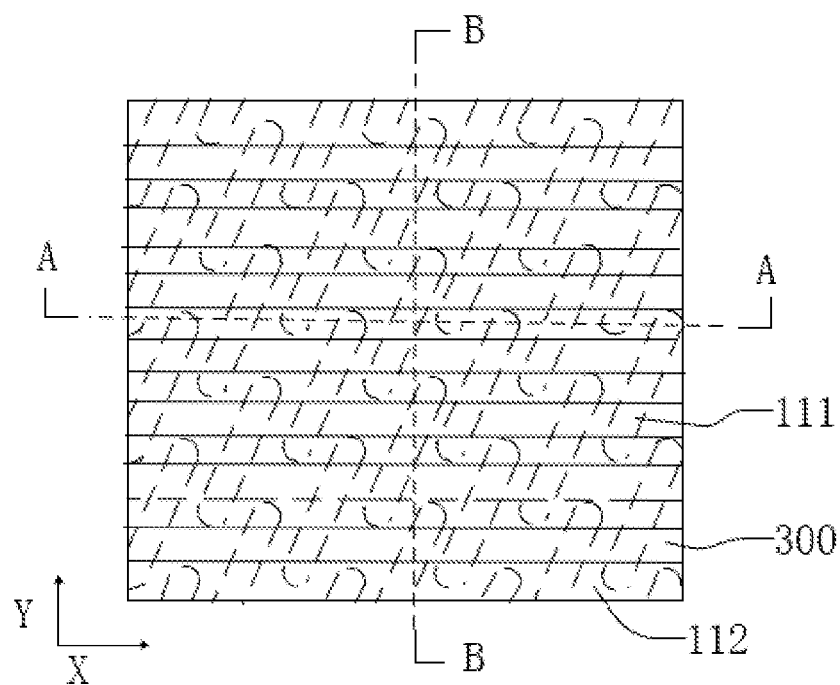
FIG. 15 is a top view of an initial structure provided in a method of manufacturing a buried bit line structure according to an exemplary embodiment.

FIG. 13 is a schematic cross-sectional diagram of an initial structure along an A-A section according to the embodiment (referring to FIG. 15). FIG. 14 is a schematic cross-sectional diagram of an initial structure along a B-B section according to the embodiment (referring to FIG. 15). FIG. 15 is a top view of an initial structure according to the embodiment. As shown in FIG. 13, FIG. 14, and FIG. 15, an initial structure 100 includes a base 110 and a protective layer 120 provided on the base 110, and the base 110 includes active region structures 111 and a dielectric layer 112.

The base 110 includes a plurality of separated active region structures 111, the active region structures 111 are separated by the dielectric layer 112, and a top surface of the active region structure 111 is flush with a top surface of the dielectric layer 112.

A material of the active region structure 111 is a semiconductor material, and the material of the active region structure 111 may be silicon (Si), germanium (Ge), silicon-germanium (GeSi), or silicon carbide (SiC); may also be silicon on insulator (SOI) or germanium on insulator (GOI); or may also be another material, for example, a III-V compound such as gallium arsenide. The material of the active region structure in this embodiment is silicon.

A material of the dielectric layer 112 may be an insulating material such as silicon oxide, silicon nitride, or silicon oxynitride. In this embodiment, the material of the dielectric layer 112 is silicon oxide.

A material of the protective layer 120 may be an insulating material such as silicon oxide, silicon nitride, or silicon oxynitride. In this embodiment, the material of the protective layer 120 is silicon oxide.

S120: Remove the protective layer, the active region structure, and the dielectric layer partially to form an initial bit line trench, and the initial bit line trench exposes the active region structure.

Figure 19:
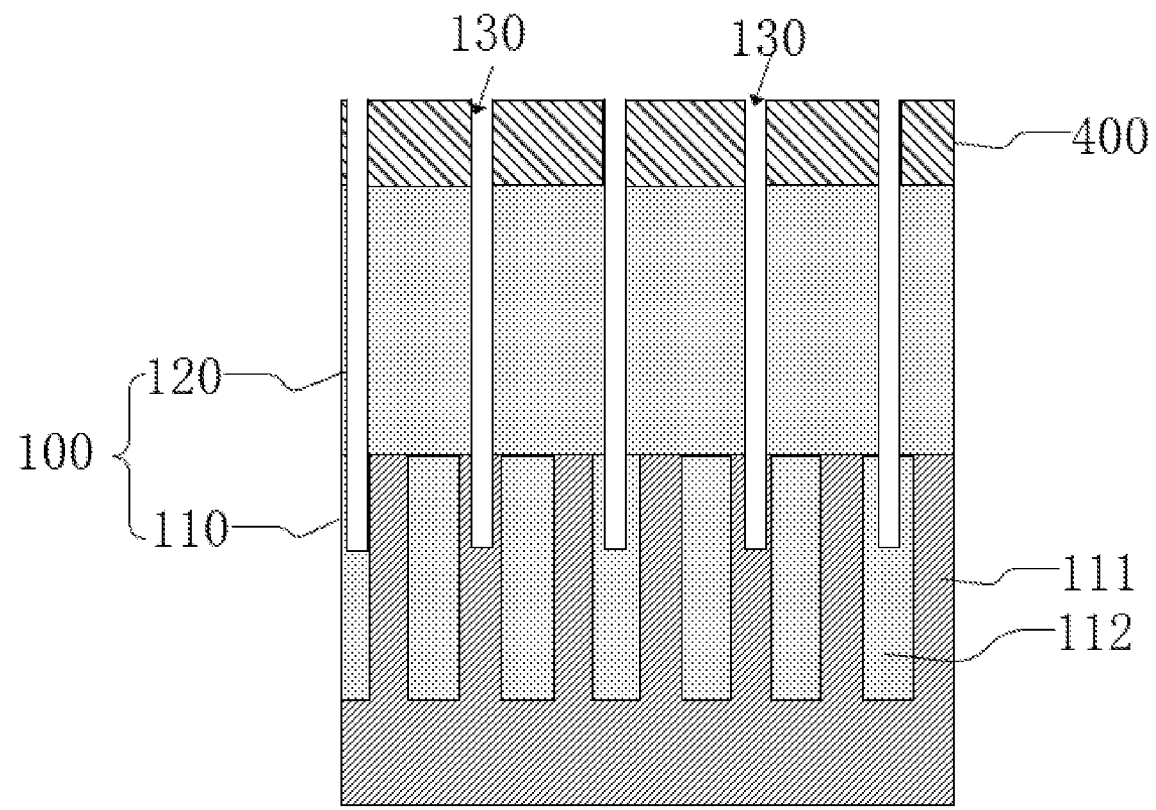
FIG. 19 is a schematic cross-sectional diagram along an A-A section after an initial bit line trench is formed in the initial structure in the method of manufacturing a buried bit line structure according to an exemplary embodiment in FIG. 15.
Figure 20:
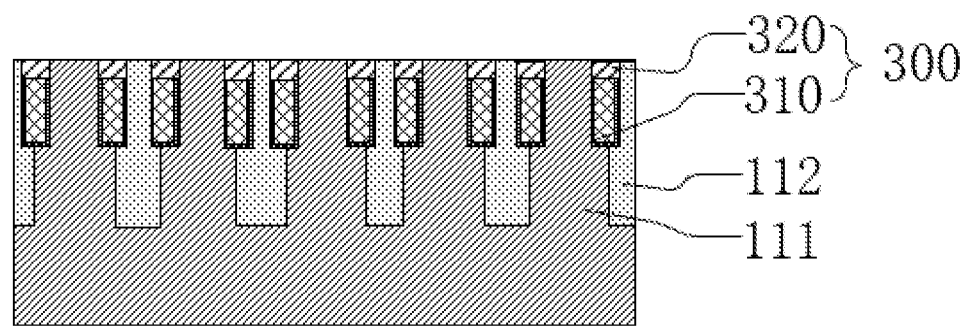
FIG. 20 is a schematic cross-sectional diagram along a B-B section after an initial bit line trench is formed in the initial structure in the method of manufacturing a buried bit line structure according to an exemplary embodiment in FIG. 15.

FIG. 19 is a schematic cross-sectional diagram along an A-A section after an initial bit line trench is formed in an initial structure according to the embodiment (referring to FIG. 15). FIG. 20 is a schematic cross-sectional diagram along a B-B section after an initial bit line trench is formed in an initial structure (referring to FIG. 15). As shown in FIG. 19 and FIG. 20, a part of the protective layer 120 is first removed through etching, and the base 110 is exposed, and the base 110 continues to be etched to remove a part of the active region structure 111 and a part of the dielectric layer 112, and form the initial bit line trench 130. That is, one part of the formed initial bit line trench 130 is located in the base 110, and the other part is located in the protective layer 120.

S130: Form a conductive structure, and the conductive structure is located at the bottom of the initial bit line trench.

Figure 30:
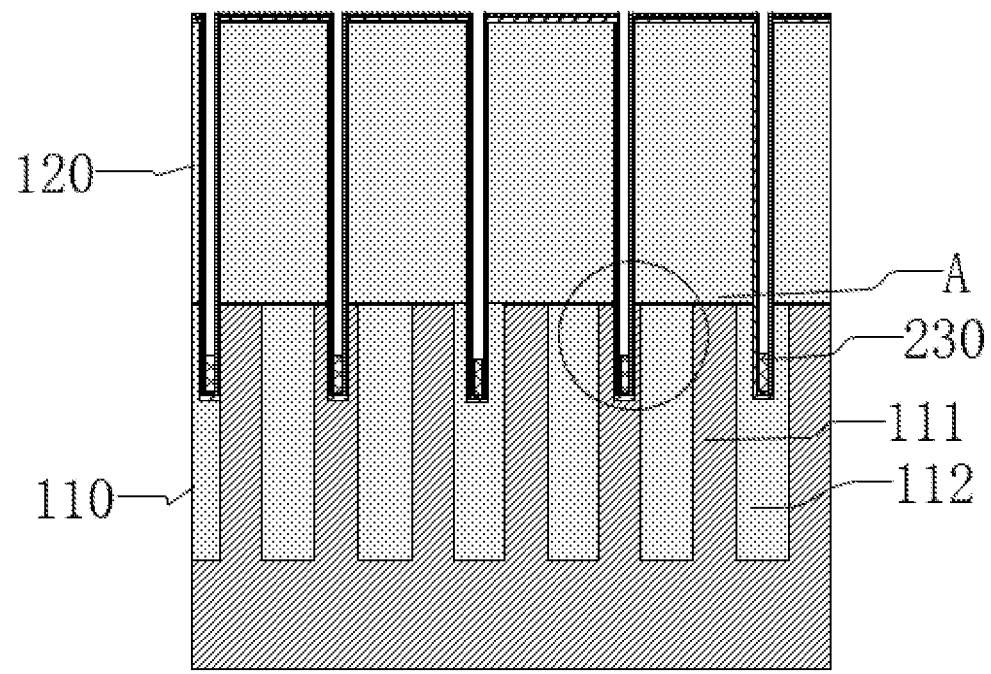
FIG. 30 is a schematic cross-sectional diagram along an A-A section after a conductive structure is formed by removing a part of an initial conductive structure in the method of manufacturing a buried bit line structure according to an exemplary embodiment in FIG. 15.
Figure 31:
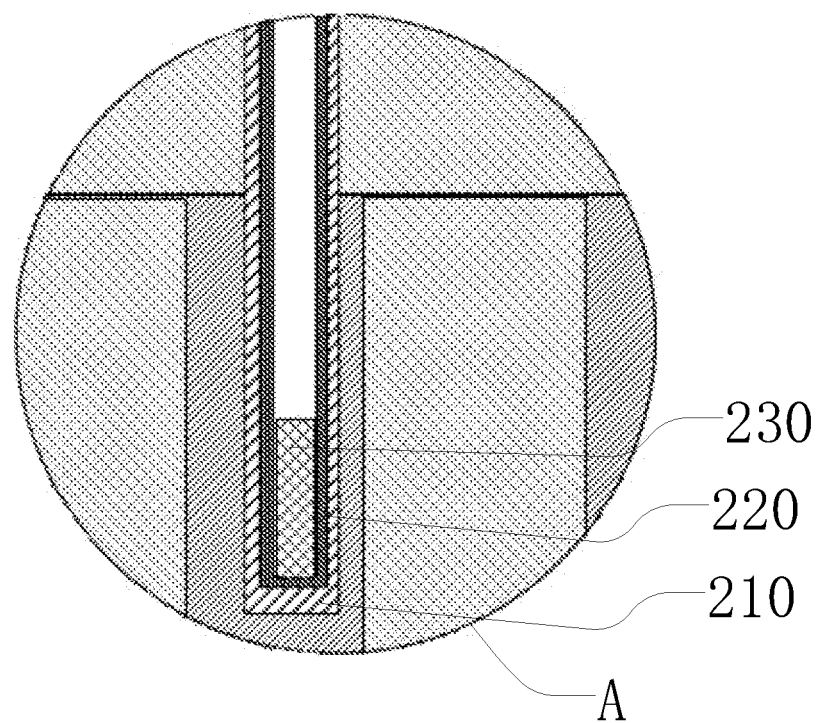
FIG. 31 is a partial enlarged view of an A position in FIG. 30.
Figure 32:
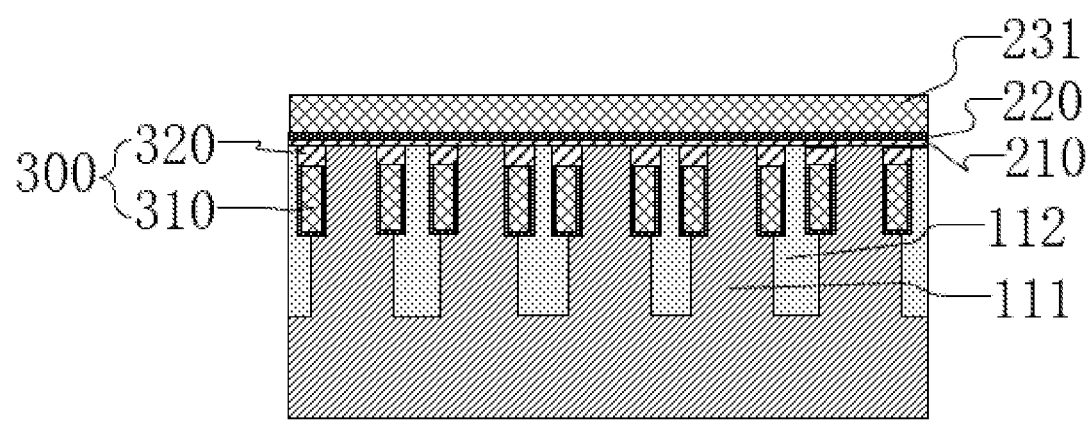
FIG. 32 is a schematic cross-sectional diagram along a B-B section after a conductive structure is formed by removing a part of an initial conductive structure in the method of manufacturing a buried bit line structure according to an exemplary embodiment in FIG. 15.

FIG. 30 is a schematic cross-sectional diagram of a conductive structure formed by removing a part of an initial conductive structure along an A-A section according to the embodiment (referring to FIG. 15). FIG. 31 is a partial enlarged view of an A position in FIG. 30. FIG. 32 is a schematic cross-sectional diagram of a conductive structure formed by removing a part of an initial conductive structure along a B-B section according to the embodiment (referring to FIG. 15). As shown in FIG. 30, FIG. 31, and FIG. 32, a material of the conductive structure 230 includes one or more of a conductive metal, a conductive metal nitride, or a conductive alloy, for example, the material of the conductive structure may be titanium, tantalum, or tungsten.

S140: Form a bit line contact structure, the bit line contact structure covers the conductive structure, and a top surface of the bit line contact structure is lower than a top surface of the active region structure.

Figure 42:
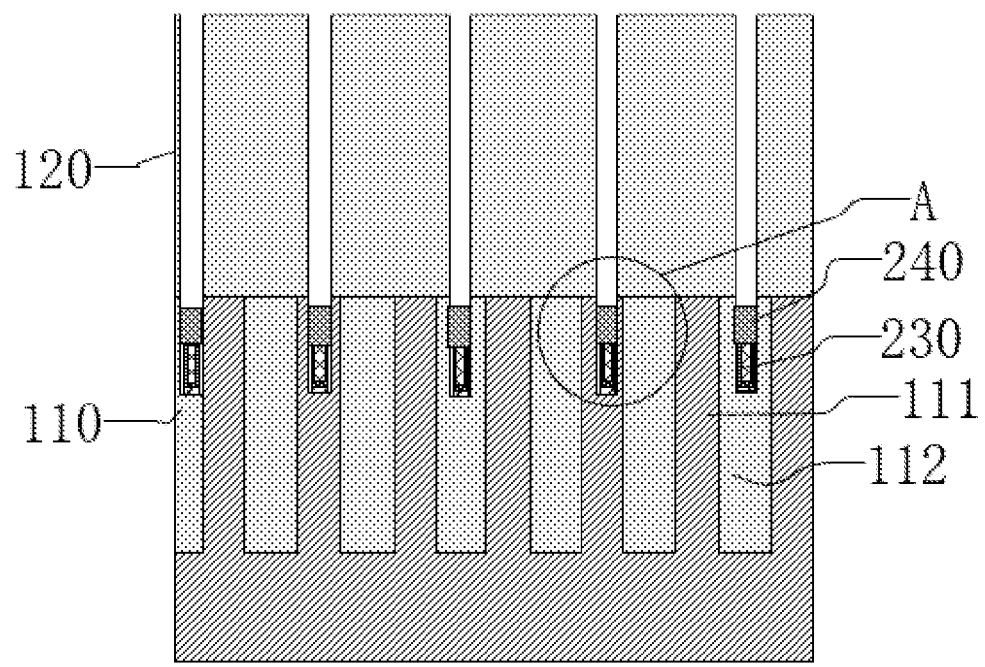
FIG. 42 is a schematic cross-sectional diagram along an A-A section after a bit line contact structure is formed in a method of manufacturing a buried bit line structure according to an exemplary embodiment.
Figure 43:
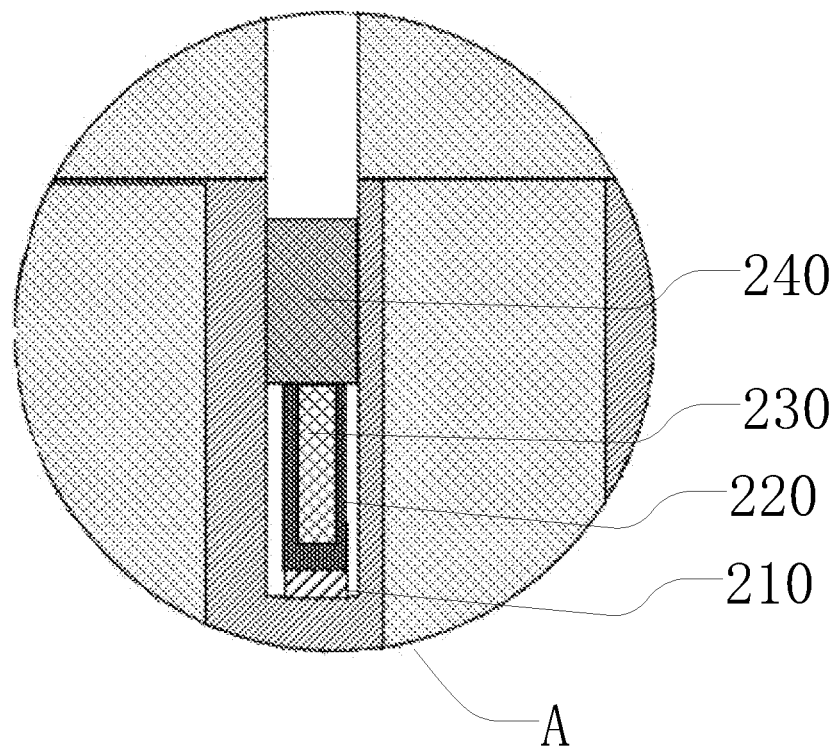
FIG. 43 is a partial enlarged view of an A position in FIG. 42.
Figure 44:
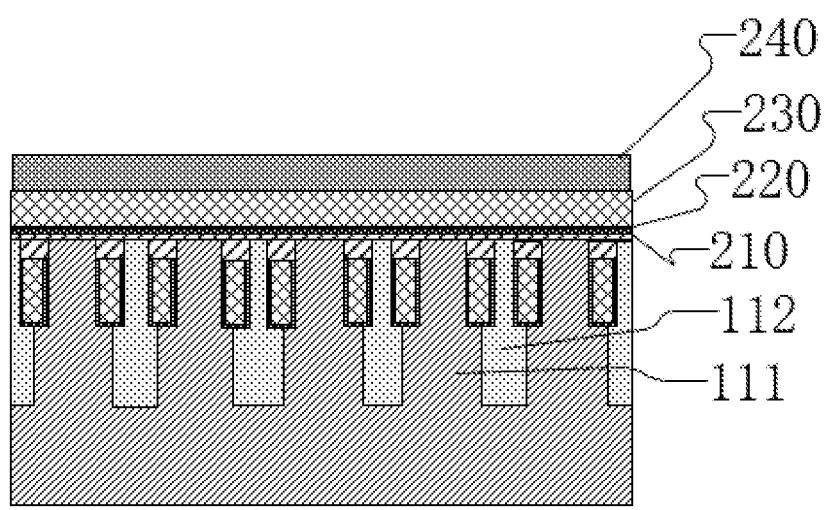
FIG. 44 is a schematic cross-sectional diagram along a B-B section after a bit line contact structure is formed in a method of manufacturing a buried bit line structure according to an exemplary embodiment.
Figure 45:
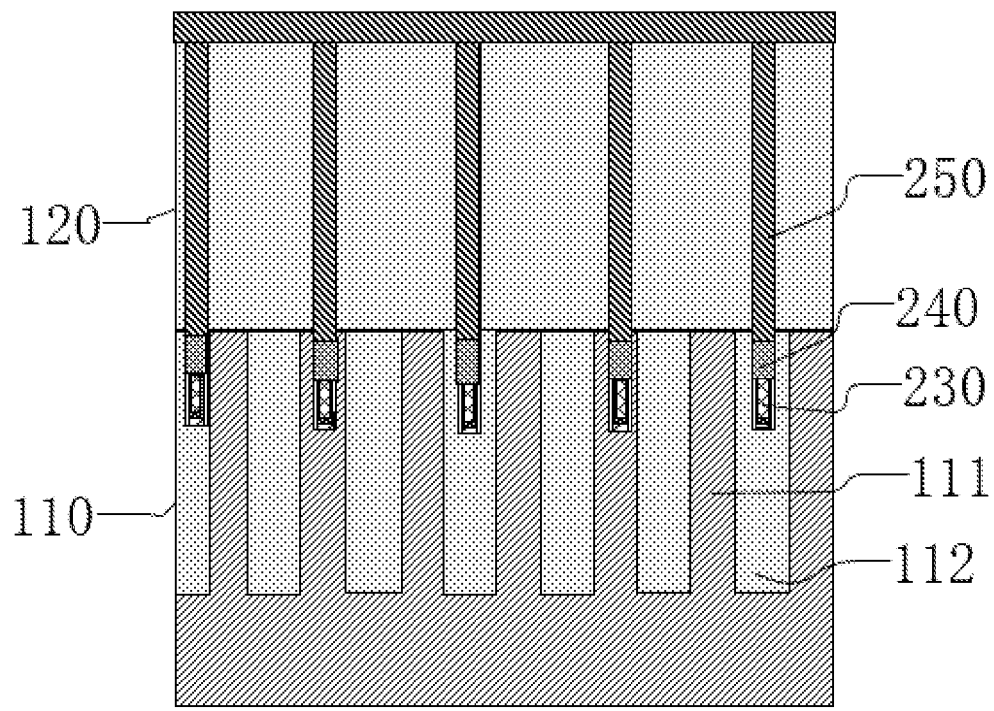
FIG. 45 is a schematic cross-sectional diagram along an A-A section after an insulation structure is deposited in a method of manufacturing a buried bit line structure according to an exemplary embodiment.
Figure 46:
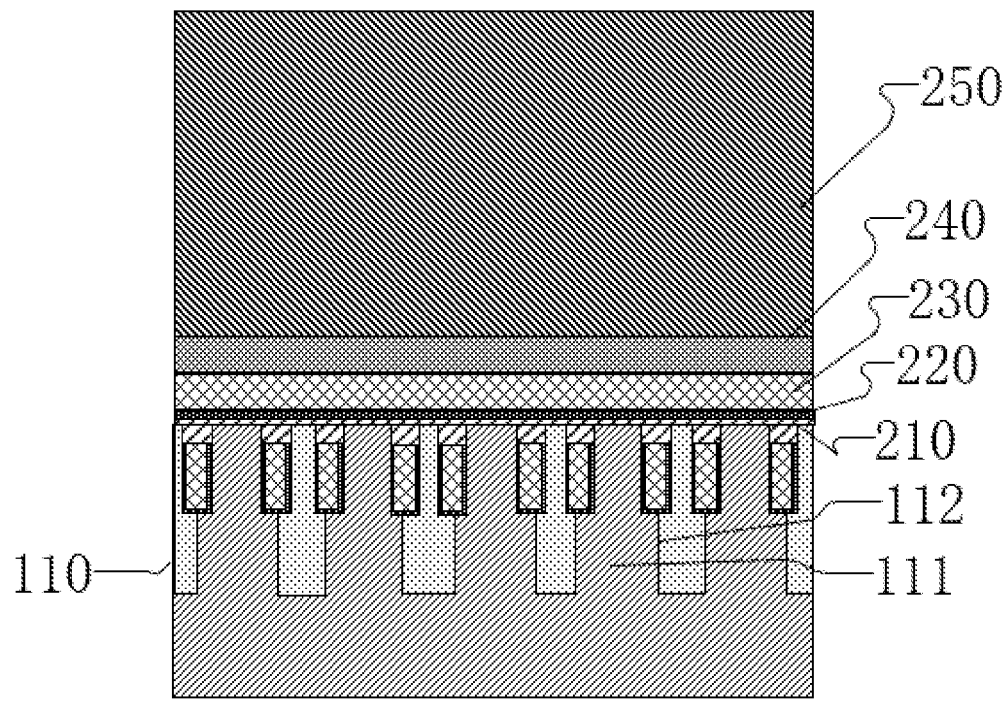
FIG. 46 is a schematic cross-sectional diagram along a B-B section after an insulation structure is deposited in a method of manufacturing a buried bit line structure according to an exemplary embodiment.

FIG. 42 is a schematic cross-sectional diagram along an A-A section after a bit line contact structure is formed according to the embodiment (referring to FIG. 15). FIG. 43 is a partial enlarged view of an A position in FIG. 42. FIG. 44 is a schematic cross-sectional diagram along a B-B section after a bit line contact structure is formed according to the embodiment (referring to FIG. 15). As shown in FIG. 42, FIG. 43, and FIG. 44, a material of the bit line contact structure 240 includes polycrystalline silicon.

S150: Form an insulation structure, the insulation structure covers the bit line contact structure, and a top surface of the insulation structure is flush with a top surface of the protective layer.

Figure 47:
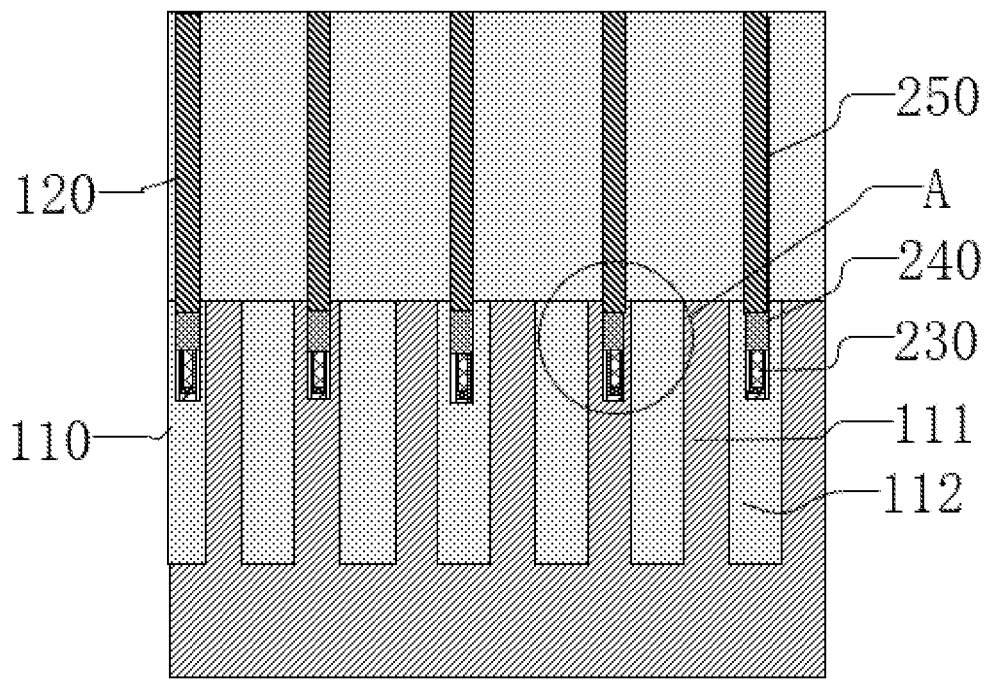
FIG. 47 is a schematic cross-sectional diagram along an A-A section after an insulation structure is formed in a method of manufacturing a buried bit line structure according to an exemplary embodiment.
Figure 48:
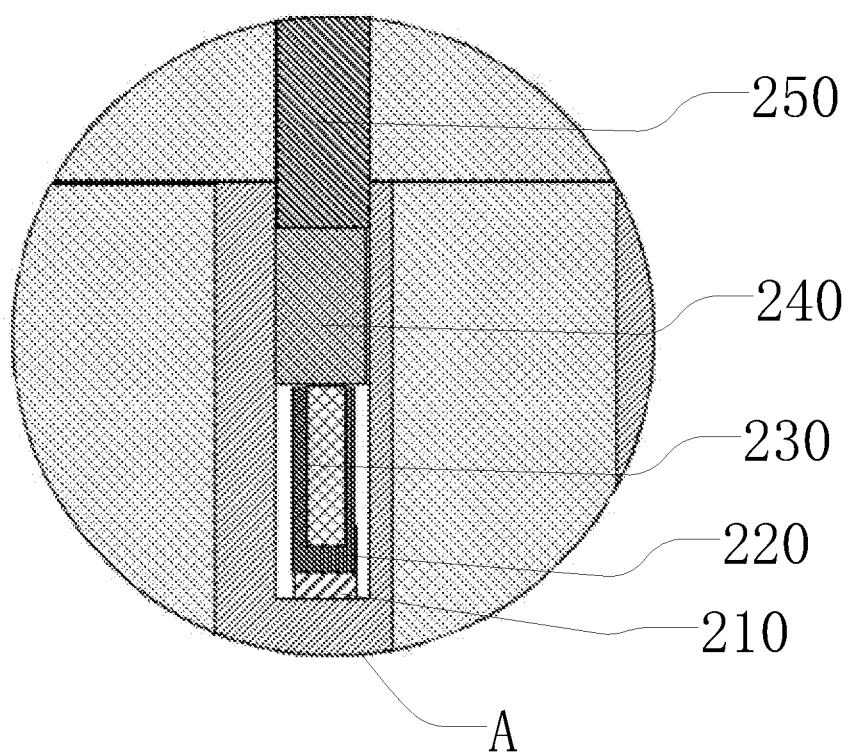
FIG. 48 is a partial enlarged view of an A position in FIG. 47.
Figure 49:
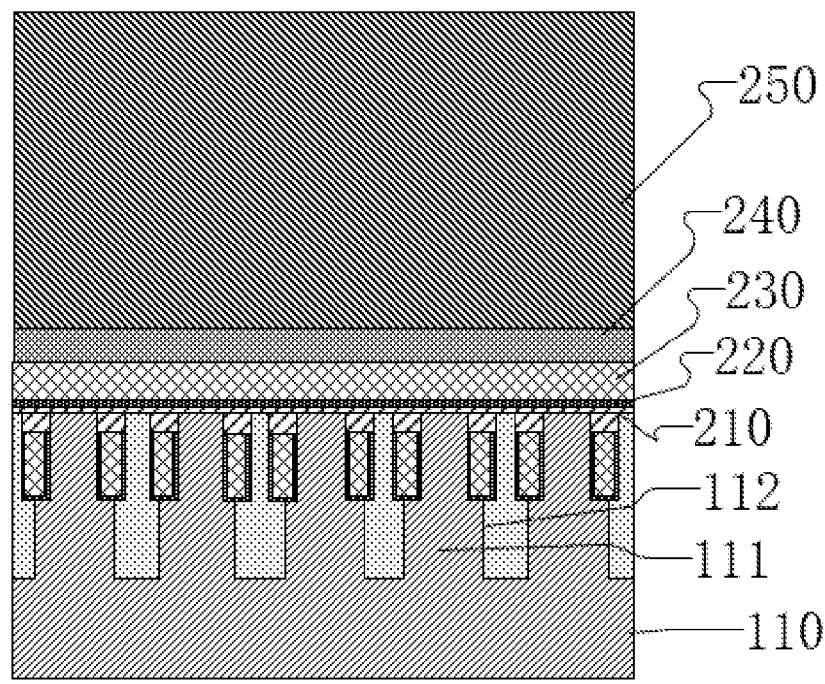
FIG. 49 is a schematic cross-sectional diagram along a B-B section after an insulation structure is formed in a method of manufacturing a buried bit line structure according to an exemplary embodiment.

FIG. 47 is a schematic cross-sectional diagram along an A-A section after an insulation structure is formed according to the embodiment (referring to FIG. 15). FIG. 48 is a partial enlarged view of an A position in FIG. 47. FIG. 49 is a schematic cross-sectional diagram along a B-B section after an insulation structure is formed according to the embodiment (referring to FIG. 15).

As shown in FIG. 47, FIG. 48, and FIG. 49, for example, a material of the insulation structure 250 may be an insulating material such as silicon oxide, silicon nitride, or silicon oxynitride. In this embodiment, the material of the insulation structure 250 is silicon nitride. A mixing gas of one or more of ammonia ($NH_3$), nitrogen ($N_2$), or hydrogen ($H_2$) is used as a reaction gas, and is deposited as silicon nitride by using an atomic layer deposition process, to form the insulation structure 250.

In this embodiment, a bit line structure is formed in the initial bit line trench, and that the formed bit line structure is a linear structure can be ensured by defining a shape of the initial bit line trench. The bit line structure does not need to be etched, to avoid damaging the bit line structure in an etching process, and ensure the integrity of the formed bit line structure. This improves a structure yield.

Figure 2:
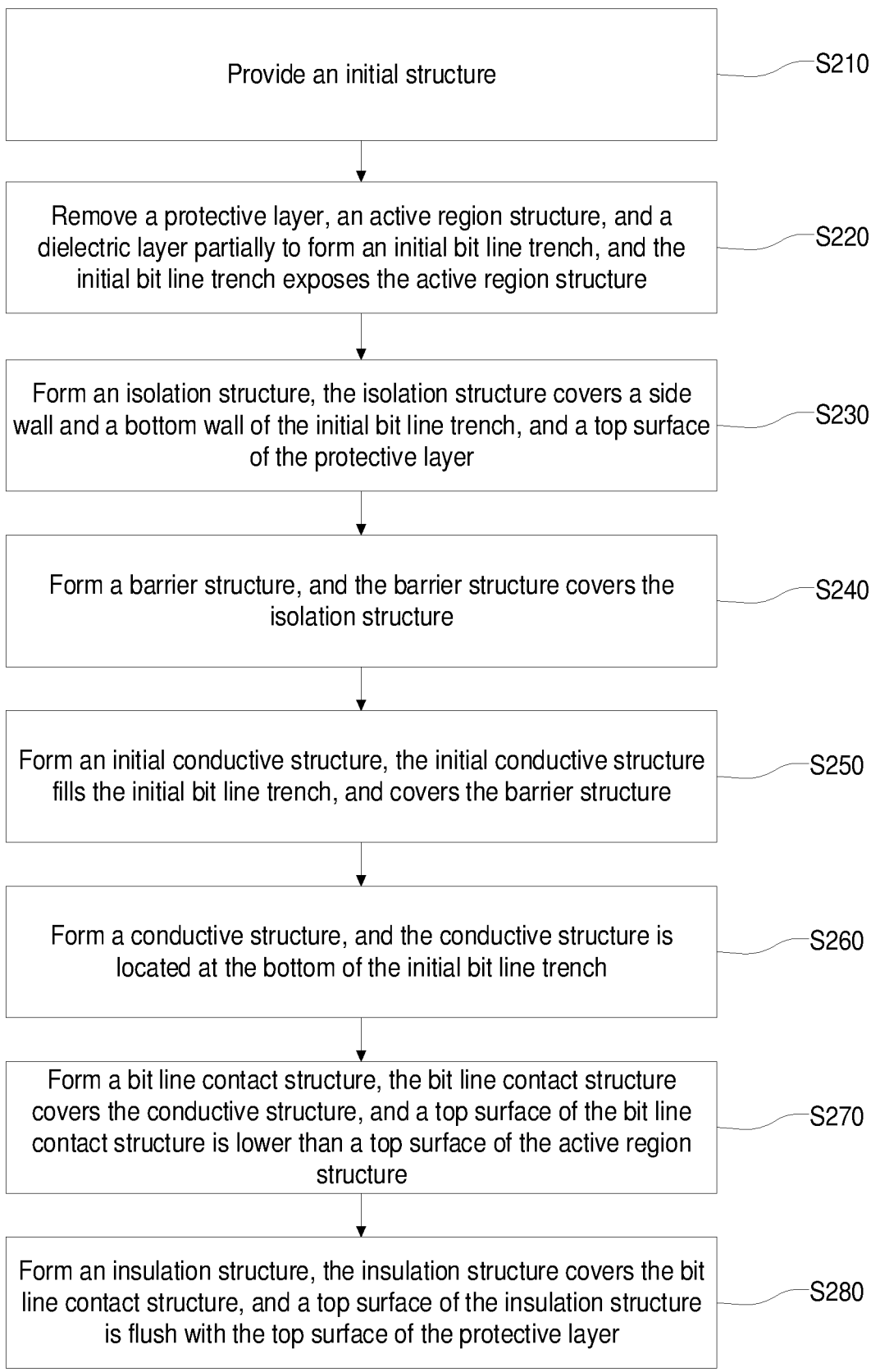
FIG. 2 is a flowchart of a method of manufacturing a buried bit line structure according to an exemplary embodiment.

According to an exemplary embodiment, a method of manufacturing a buried bit line structure is provided in this exemplary embodiment, as shown in FIG. 2. FIG. 2 is a flowchart of a method of manufacturing a buried bit line structure according to an exemplary embodiment of the present disclosure. The method includes:

S210: Provide an initial structure.

The initial structure includes a base and a protective layer provided on the base, and the base includes active region structures and a dielectric layer.

S220: Remove the protective layer, the active region structure, and the dielectric layer partially to form an initial bit line trench, and the initial bit line trench exposes the active region structure.

S230: Form an isolation structure, the isolation structure covers a side wall and a bottom wall of the initial bit line trench, and a top surface of the protective layer.

Figure 21:
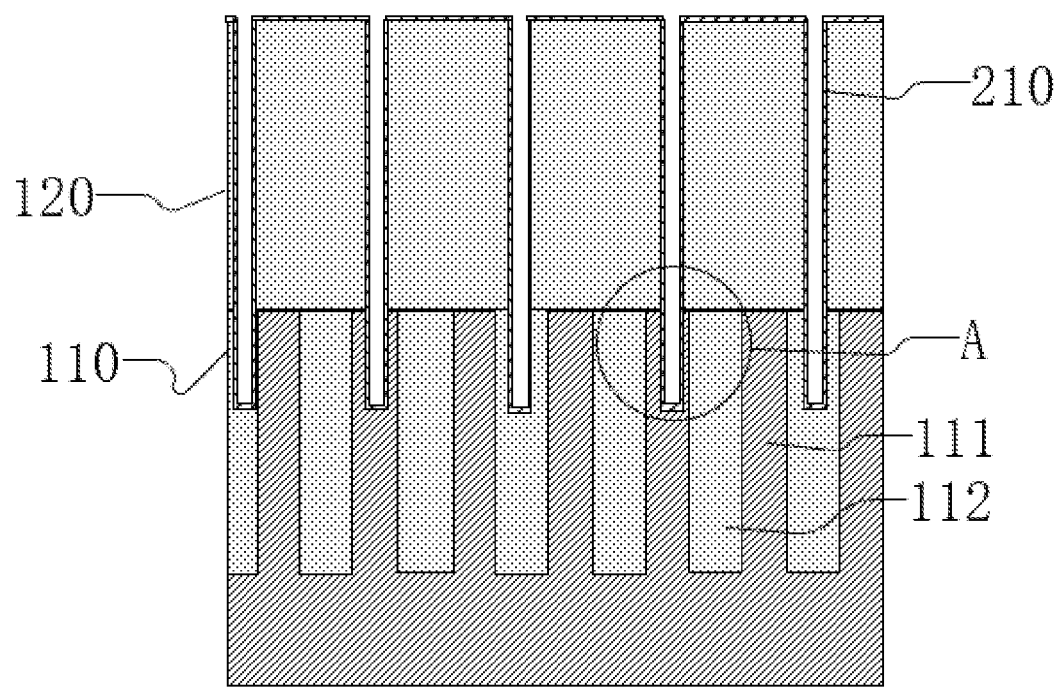
FIG. 21 is a schematic cross-sectional diagram along an A-A section after an isolation structure is formed in the method of manufacturing a buried bit line structure according to an exemplary embodiment in FIG. 15.
Figure 22:
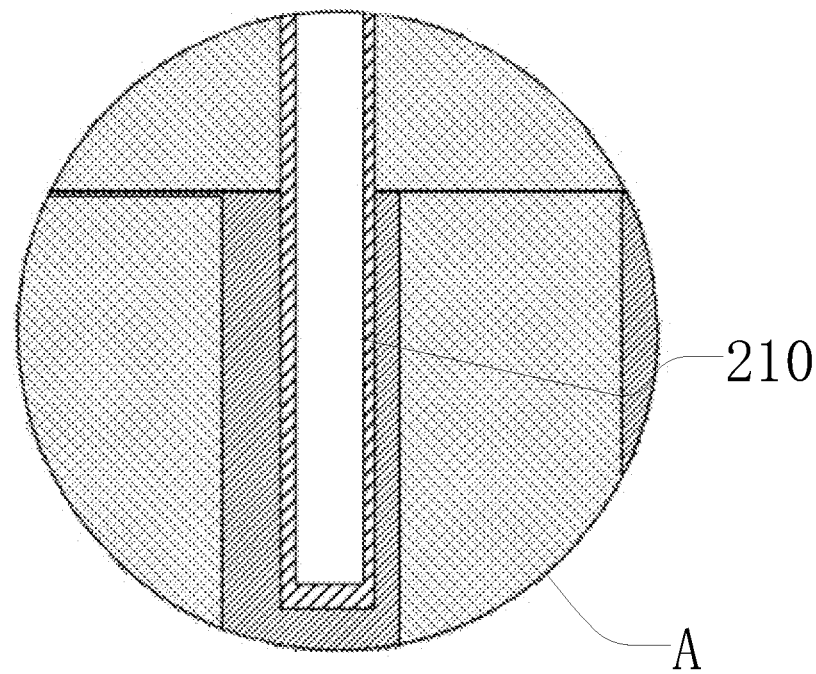
FIG. 22 is a partial enlarged view of an A position in FIG. 21.
Figure 23:
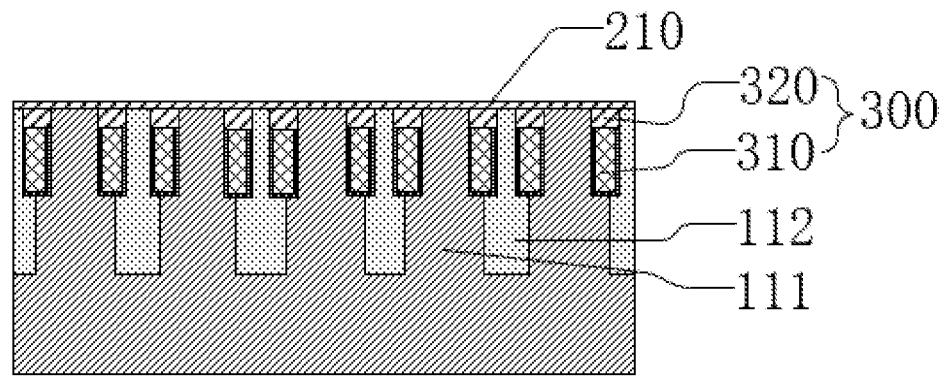
FIG. 23 is a schematic cross-sectional diagram along a B-B section after an isolation structure is formed in the method of manufacturing a buried bit line structure according to an exemplary embodiment in FIG. 15.

FIG. 21 is a schematic cross-sectional diagram along an A-A section after an isolation structure is formed according to the embodiment (referring to FIG. 15). FIG. 22 is a partial enlarged view of an A position in FIG. 21. FIG. 23 is a schematic cross-sectional diagram along a B-B section after an isolation structure is formed according to the embodiment (referring to FIG. 15). As shown in FIG. 21, FIG. 22, and FIG. 23, the isolation structure 210 may be formed by using an atomic layer deposition (ALD) process.

For example, the material of the isolation structure 210 may be a combination of one or more of silicon nitride, silicon oxynitride, or silicon carbonitride. In this embodiment, the material of the isolation structure 210 is silicon nitride. A mixing gas of one or more of ammonia ($NH_3$), nitrogen ($N_2$), or hydrogen ($H_2$) is used as a reaction gas, and is deposited as silicon nitride by using an atomic layer deposition process, to form the isolation structure 210.

S240: Form a barrier structure, and the barrier structure covers the isolation structure.

Figure 24:
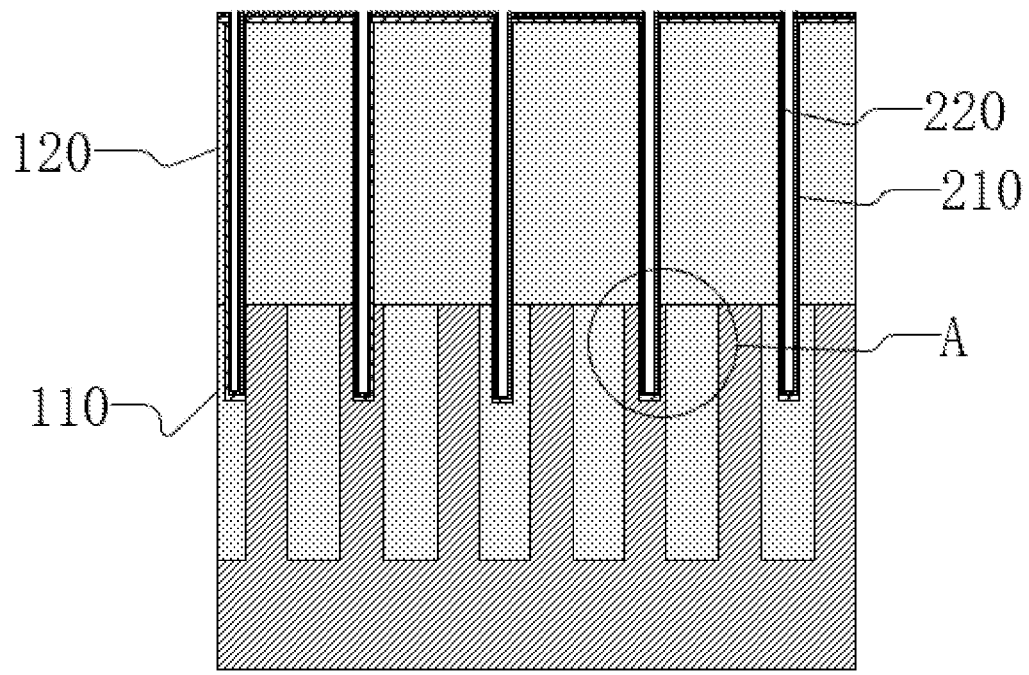
FIG. 24 is a schematic cross-sectional diagram along an A-A section after a barrier structure is formed in the method of manufacturing a buried bit line structure according to an exemplary embodiment in FIG. 15.
Figure 25:
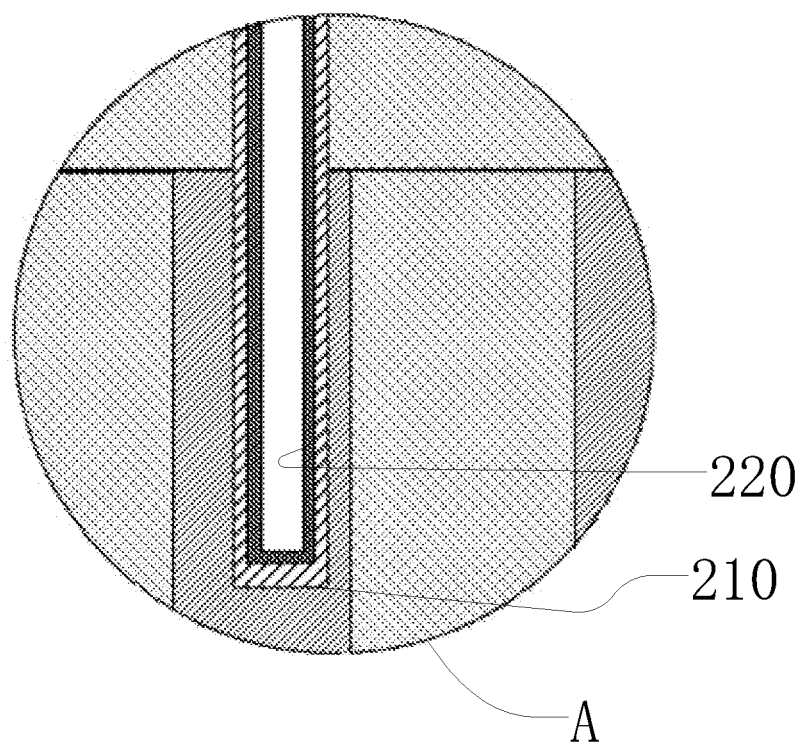
FIG. 25 is a partial enlarged view of an A position in FIG. 24.
Figure 26:
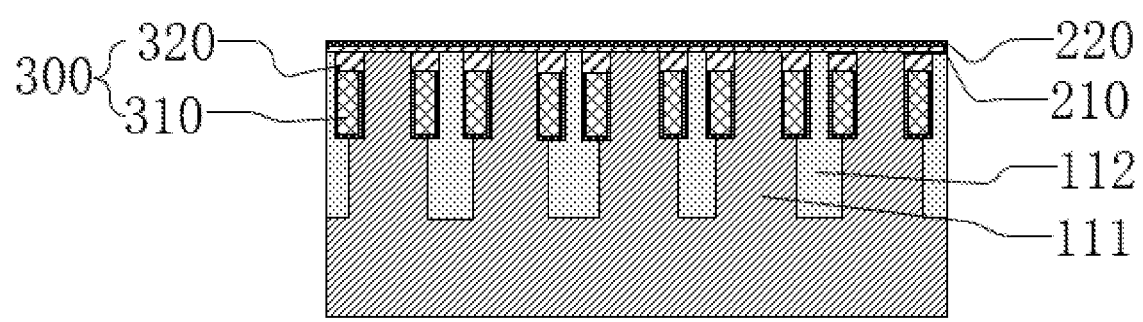
FIG. 26 is a schematic cross-sectional diagram along a B-B section after a barrier structure is formed in the method of manufacturing a buried bit line structure according to an exemplary embodiment in FIG. 15.

FIG. 24 is a schematic cross-sectional diagram along an A-A section after a barrier structure is formed according to the embodiment (referring to FIG. 15). FIG. 25 is a partial enlarged view of an A position in FIG. 24. FIG. 26 is a schematic cross-sectional diagram along a B-B section after a barrier structure is formed according to the embodiment (referring to FIG. 15). As shown in FIG. 24, FIG. 25, and FIG. 26, the barrier structure 220 may be formed by using an atomic layer deposition (ALD) process, and a material of the barrier structure 220 may be titanium nitride.

S250: Form an initial conductive structure, the initial conductive structure fills the initial bit line trench, and covers the barrier structure.

Figure 27:
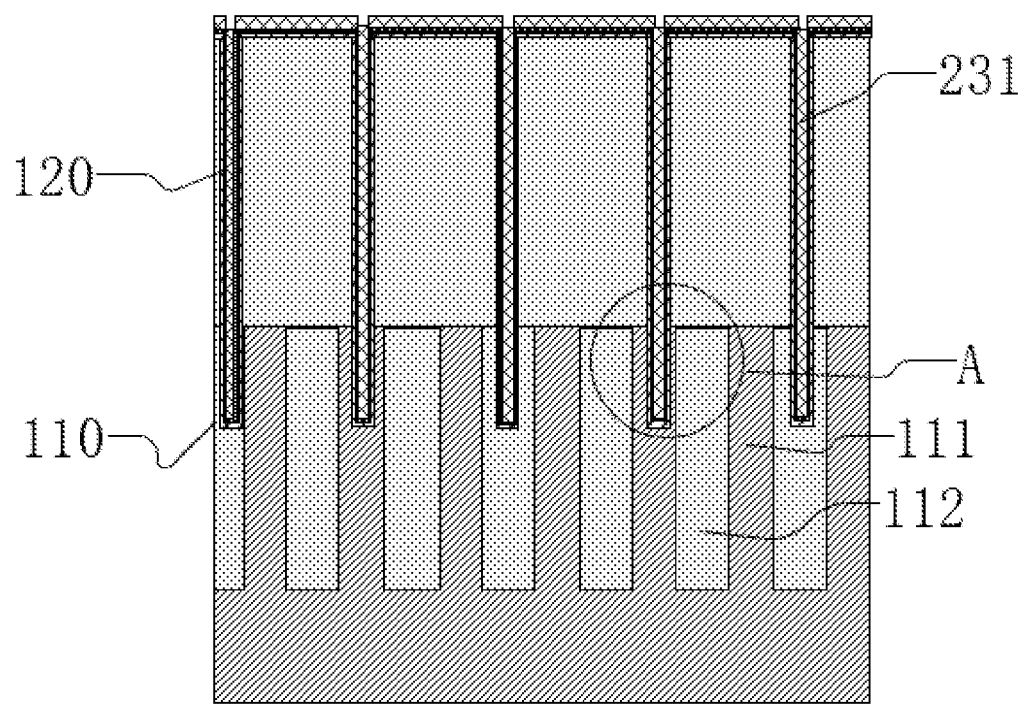
FIG. 27 is a schematic cross-sectional diagram along an A-A section after an initial conductive structure is formed in the method of manufacturing a buried bit line structure according to an exemplary embodiment in FIG. 15.
Figure 28:
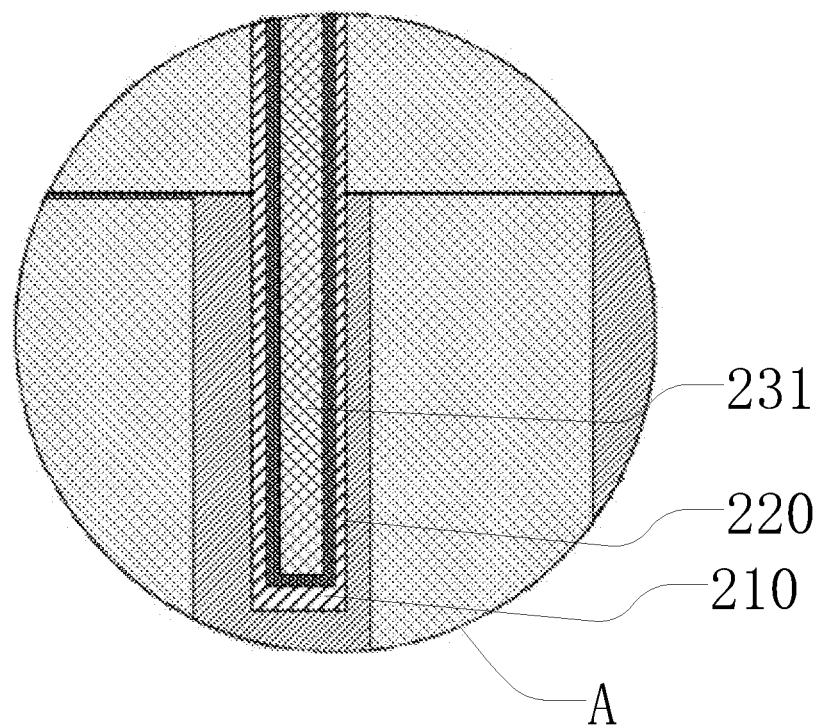
FIG. 28 is a partial enlarged view of an A position in FIG. 27.
Figure 29:
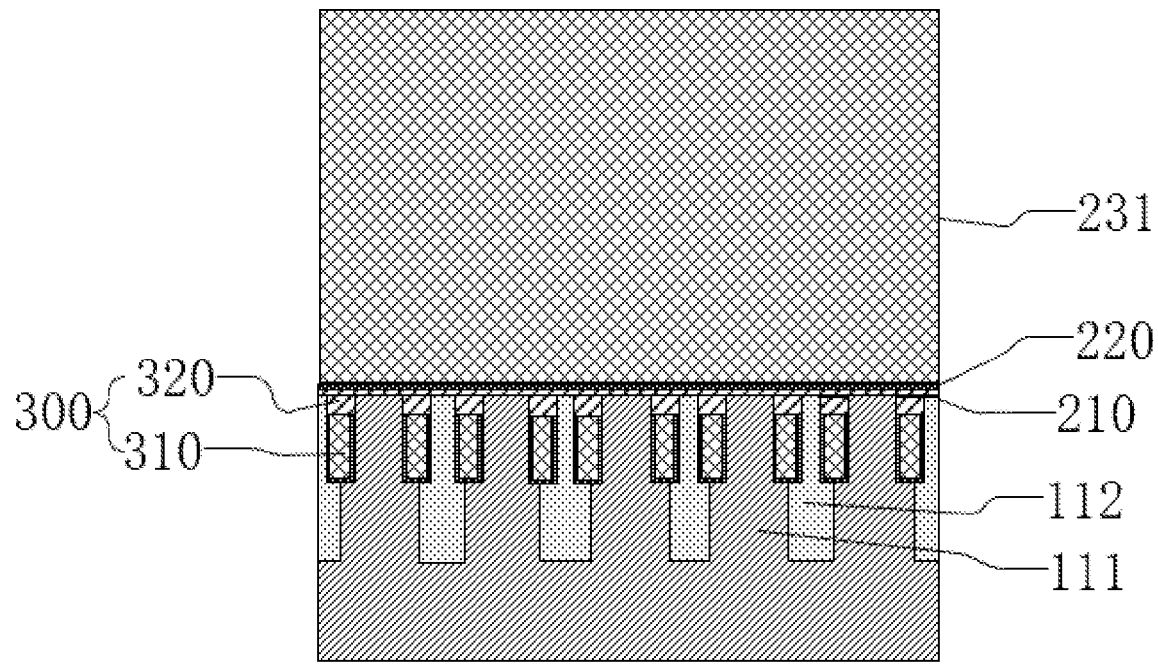
FIG. 29 is a schematic cross-sectional diagram along a B-B section after an initial conductive structure is formed in the method of manufacturing a buried bit line structure according to an exemplary embodiment in FIG. 15.

FIG. 27 is a schematic cross-sectional diagram along an A-A section after an initial conductive structure is formed according to the embodiment (referring to FIG. 15). FIG. 28 is a partial enlarged view of an A position in FIG. 27. FIG. 29 is a schematic cross-sectional diagram along a B-B section after an initial conductive structure is formed according to the embodiment (referring to FIG. 15). As shown in FIG. 27, FIG. 28, and FIG. 29, the initial conductive structure 231 may be formed by using an atomic layer deposition (ALD) process, and the initial conductive structure 231 covers the barrier structure 220.

S260: Form a conductive structure, and the conductive structure is located at the bottom of the initial bit line trench.

S270: Form a bit line contact structure, the bit line contact structure covers the conductive structure, and a top surface of the bit line contact structure is lower than a top surface of the active region structure.

S280: Form an insulation structure, the insulation structure covers the bit line contact structure, and a top surface of the insulation structure is flush with a top surface of the protective layer.

In the buried bit line structure formed in this embodiment, the conductive structure is buried in the base, and before the conductive structure is formed, the isolation structure is first formed to isolate the conductive structure from the base, to avoid direct contact between the formed conductive structure and the base.

Figure 3:
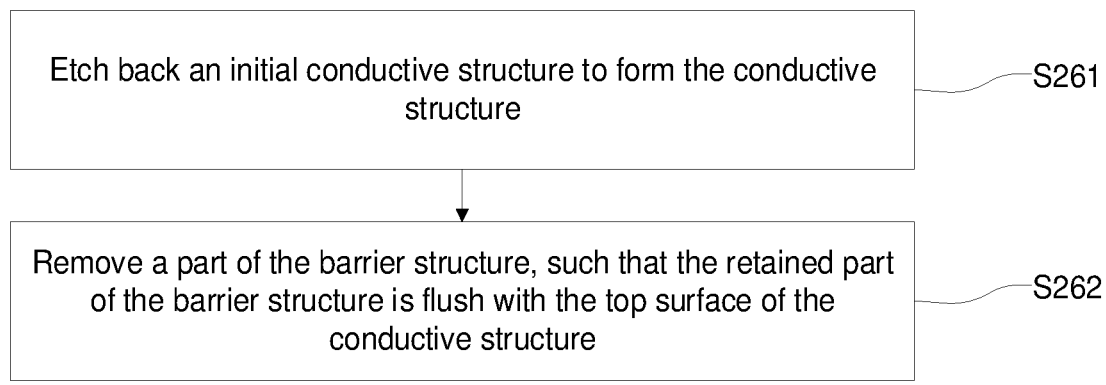
FIG. 3 is a flowchart of forming a conductive structure in a method of manufacturing a buried bit line structure according to an exemplary embodiment.

According to an exemplary embodiment, this embodiment is a description of the implementation of step S260 of the foregoing embodiment. FIG. 3 is a flowchart of step S260, as shown in FIG. 3, in a method of manufacturing a buried bit line structure according to the embodiment.

The forming a conductive structure includes:

S261: Etch back an initial conductive structure to form the conductive structure.

FIG. 30 is a schematic cross-sectional diagram along an A-A section after a conductive structure is formed by removing a part of an initial conductive structure according to the embodiment (referring to FIG. 15). FIG. 31 is a partial enlarged view of an A position in FIG. 30. FIG. 32 is a schematic cross-sectional diagram along a B-B section after a conductive structure is formed by removing a part of an initial conductive structure according to the embodiment (referring to FIG. 15).

As shown in FIG. 30, FIG. 31, and FIG. 32, referring to FIG. 27, FIG. 28, and FIG. 29, a part of the initial conductive structure 231 covering a top surface of the protective layer 120 and a part of the initial conductive structure 231 located in the initial bit line trench 130 are removed through etching by using a dry or wet etching process, to form the conductive structure 230, and a top surface of the conductive structure 230 is lower than a top surface of the active region structure 111. In this embodiment, a mixing gas of one or more of sulfur hexafluoride ($SF_6$), carbon tetrafluoride ($CF_4$), trifluoromethane ($CHF_3$), oxygen ($O_2$), or bromine (Ar) is used as an etching gas, to remove a part of the initial conductive structure 231 through etching.

S262: Remove a part of the barrier structure, such that a retained part of the barrier structure is flush with the top surface of the conductive structure.

Figure 33:
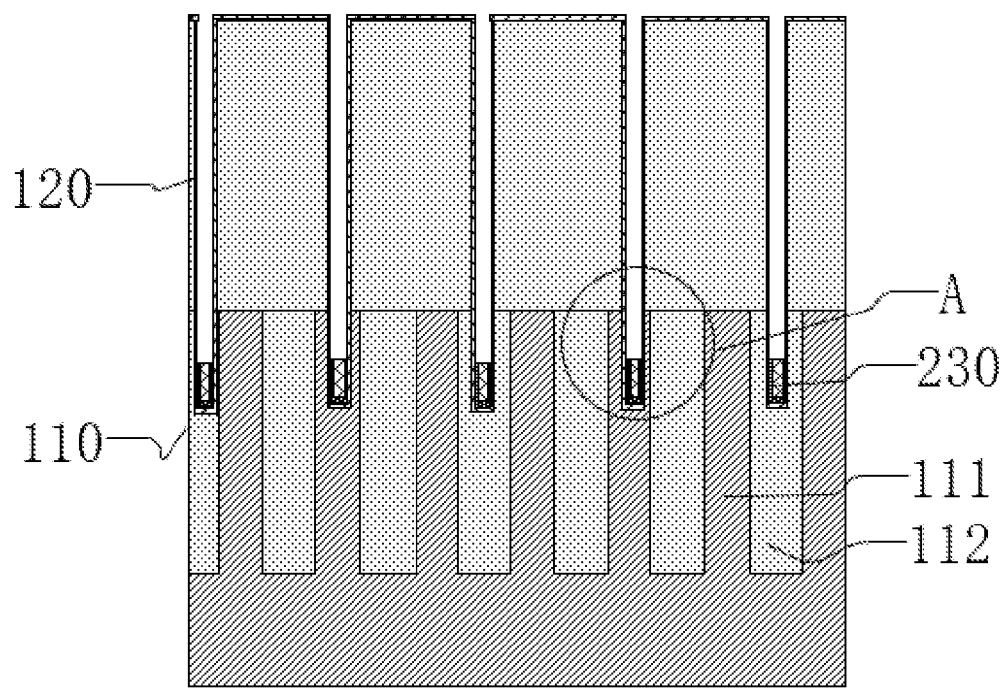
FIG. 33 is a schematic cross-sectional diagram along an A-A section after a part of a barrier structure covering a side wall of an initial bit line trench is removed in a method of manufacturing a buried bit line structure according to an exemplary embodiment.
Figure 34:
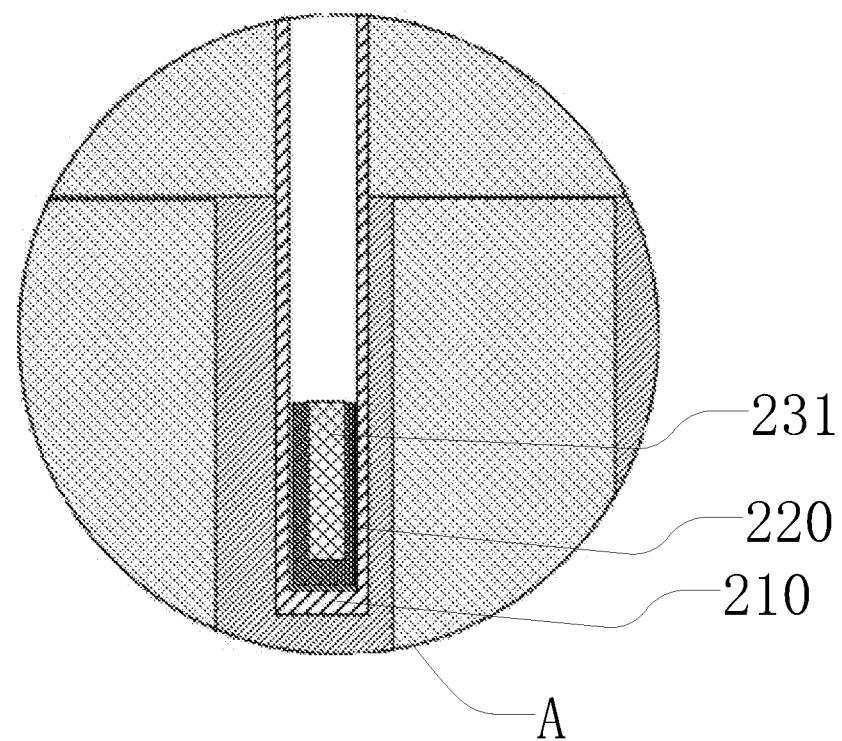
FIG. 34 is a partial enlarged view of an A position in FIG. 33.
Figure 35:
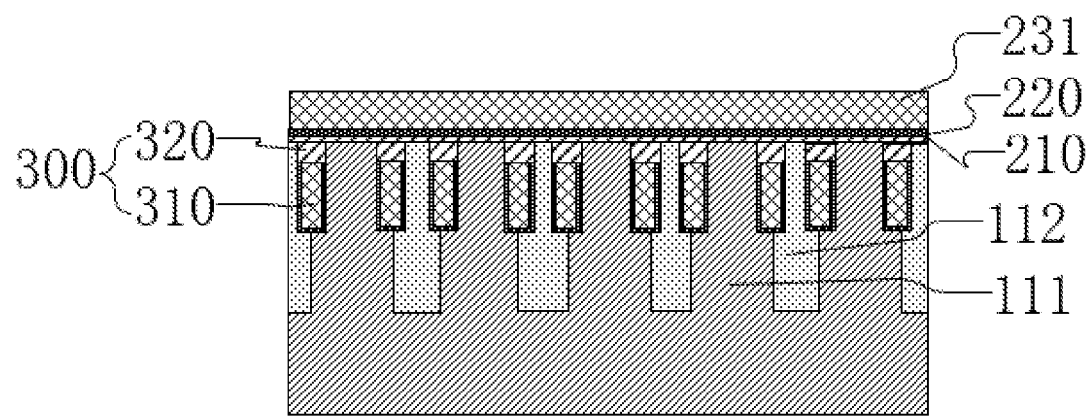
FIG. 35 is a schematic cross-sectional diagram along a B-B section after a part of a barrier structure covering a side wall of an initial bit line trench is removed in a method of manufacturing a buried bit line structure according to an exemplary embodiment.

FIG. 33 is a schematic cross-sectional diagram along an A-A section after a part of a barrier structure covering a side wall of an initial bit line trench is removed according to the embodiment (referring to FIG. 15). FIG. 34 is a partial enlarged view of an A position in FIG. 33. FIG. 35 is a schematic cross-sectional diagram along a B-B section after a part of a barrier structure covering a side wall of an initial bit line trench is removed according to the embodiment (referring to FIG. 15).

As shown in FIG. 33, FIG. 34, and FIG. 35, a part of the barrier structure 220 covering the top surface of the protective layer 120 and a part of the barrier structure 220 located in the initial bit line trench 130 are removed through etching by using a dry or wet etching process, and a top surface of a retained part of the barrier structure 220 is flush with the top surface of the conductive structure 230, such that the retained part of the barrier structure 220 covers the side wall of the conductive structure 230. In this embodiment, a mixing gas of one or more of sulfur hexafluoride ($SF_6$), carbon tetrafluoride ($CF_4$), trifluoromethane ($CHF_3$), oxygen ($O_2$), or bromine (Ar) is used as an etching gas, to remove a part of the conductive structure 231 through etching.

Step S261 and step S262 may be simultaneously performed, to simplify a process, and improve production efficiency.

Figure 4:
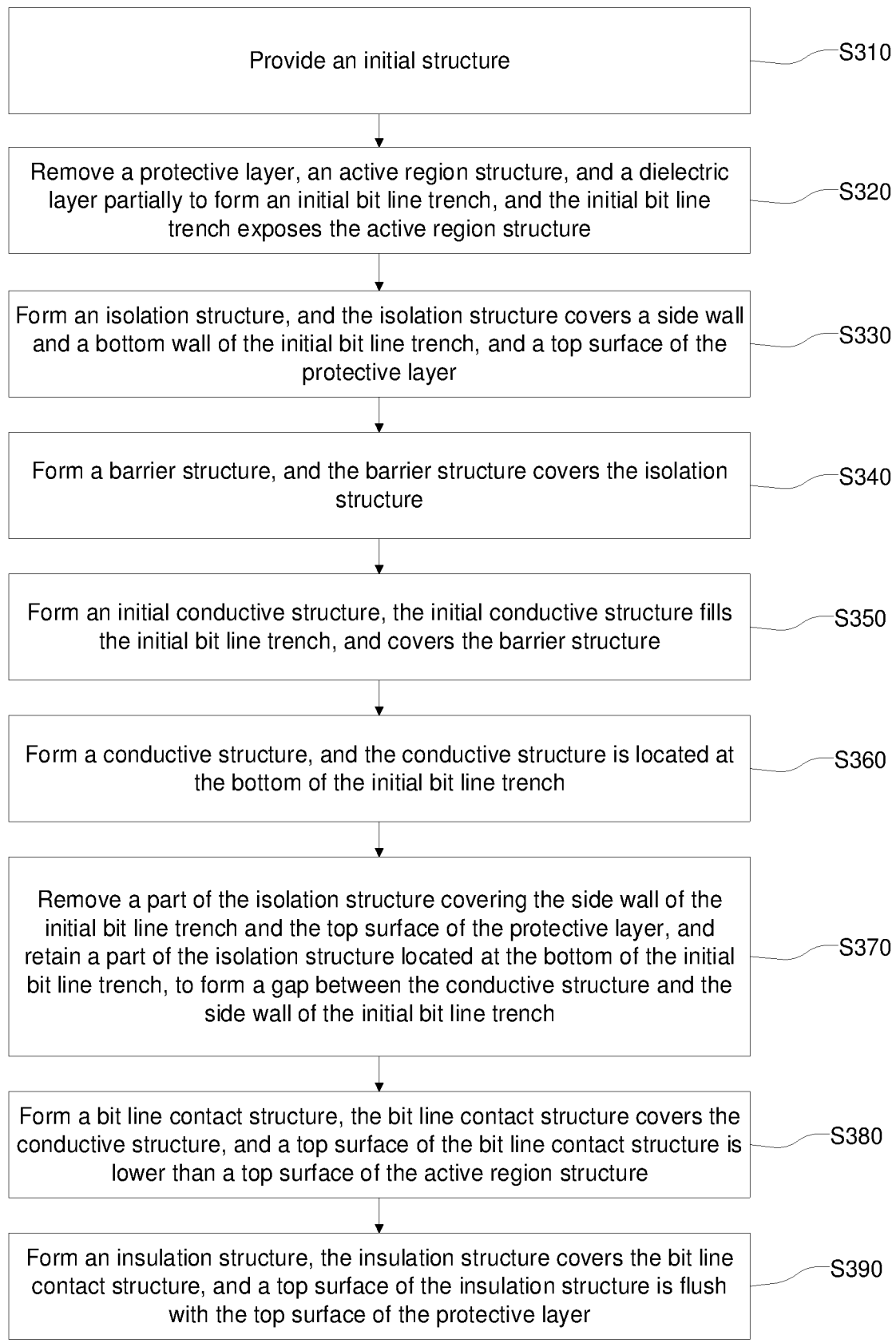
FIG. 4 is a flowchart of a method of manufacturing a buried bit line structure according to an exemplary embodiment.

According to an exemplary embodiment, a method of manufacturing a buried bit line structure according to this exemplary embodiment is provided. FIG. 4 is a flowchart of a method of manufacturing a buried bit line structure according to an exemplary embodiment of the present disclosure. As shown in FIG. 4, the method includes:

S310: Provide an initial structure.

The initial structure includes a base and a protective layer provided on the base, and the base includes active region structures and a dielectric layer.

S320: Remove the protective layer, the active region structure, and the dielectric layer partially to form an initial bit line trench, and the initial bit line trench exposes the active region structure.

S330: Form an isolation structure, and the isolation structure covers a side wall and a bottom wall of the initial bit line trench, and a top surface of the protective layer.

S340: Form a barrier structure, and the barrier structure covers the isolation structure.

S350: Form an initial conductive structure, the initial conductive structure fills the initial bit line trench, and covers the barrier structure.

S360: Form a conductive structure, and the conductive structure is located at the bottom of the initial bit line trench.

S370: Remove a part of the isolation structure covering the side wall of the initial bit line trench and the top surface of the protective layer, and reserve a part of the isolation structure located at the bottom of the initial bit line trench, to form a gap between the conductive structure and the side wall of the initial bit line trench.

Figure 36:
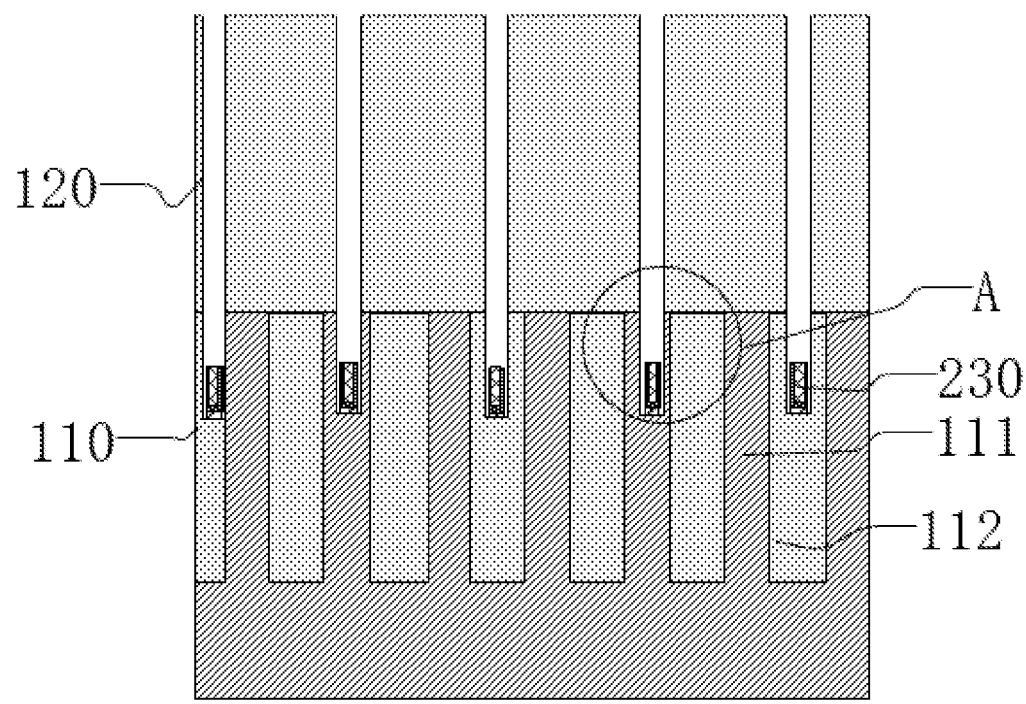
FIG. 36 is a schematic cross-sectional diagram along an A-A section after a part of an isolation structure covering a side wall of an initial bit line trench is removed in a method of manufacturing a buried bit line structure according to an exemplary embodiment.
Figure 37:
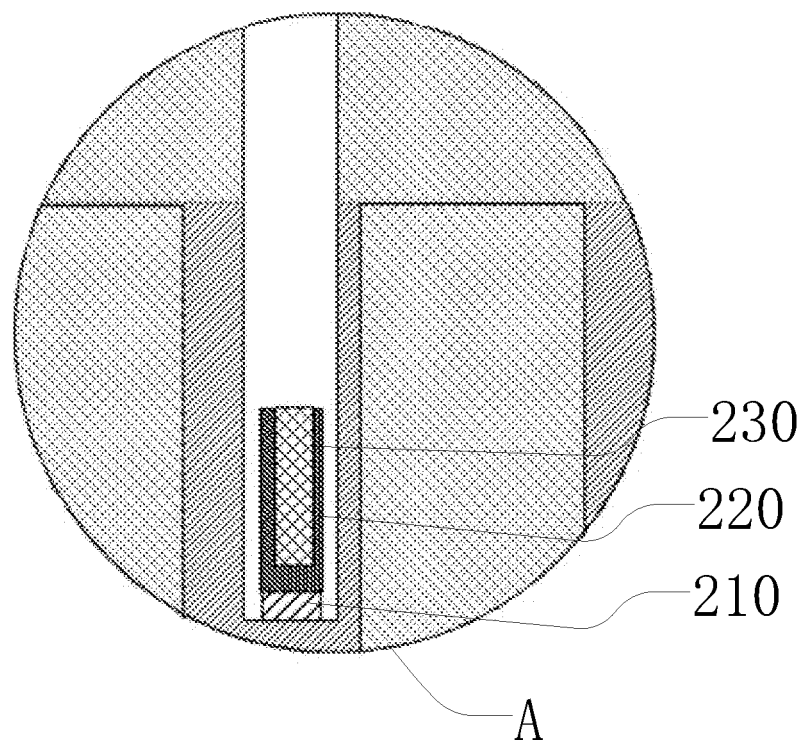
FIG. 37 is a partial enlarged view of an A position in FIG. 36.
Figure 38:
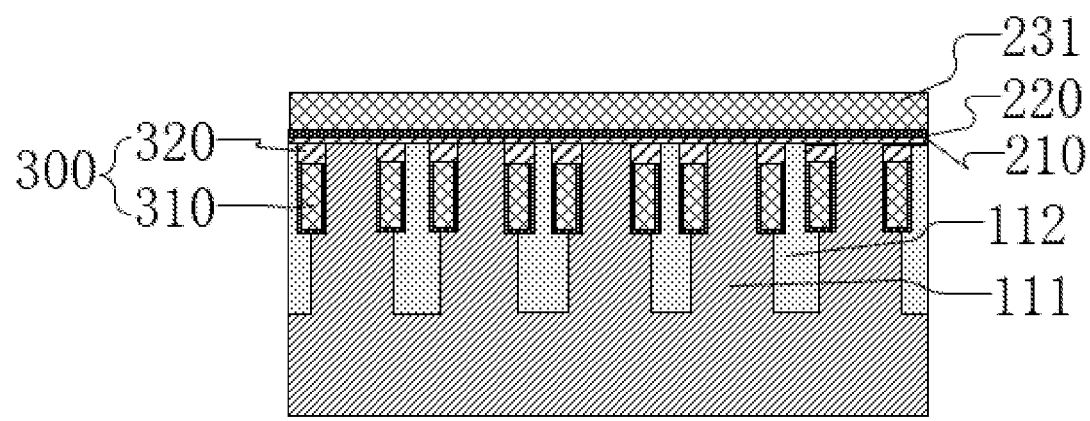
FIG. 38 is a schematic cross-sectional diagram along a B-B section after a part of an isolation structure covering a side wall of an initial bit line trench is removed in a method of manufacturing a buried bit line structure according to an exemplary embodiment.

FIG. 36 is a schematic cross-sectional diagram along an A-A section after a part of an isolation structure covering a side wall of an initial bit line trench is removed according to the embodiment (referring to FIG. 15). FIG. 37 is a partial enlarged view of an A position in FIG. 36. FIG. 38 is a schematic cross-sectional diagram along a B-B section after a part of an isolation structure covering a side wall of an initial bit line trench is removed according to the embodiment (referring to FIG. 15). As shown in FIG. 36, FIG. 37, and FIG. 38, a part of the isolation structure 210 covering the top surface of the protective layer 120 and part or all of a part of the isolation structure 210 covering the side wall of the initial bit line trench 130 are removed through etching by using a dry etching process, and a part of the isolation structure 210 covering the bottom of the initial bit line trench 130 is retained, wherein the retained part of the isolation structure 210 isolates the conductive structure 230 from the base 110 to avoid direct contact between the conductive structure 230 and the base 110. In this embodiment, a mixing gas of one or more of silane ($SIH_4$), phosphine ($NH_3$), nitrogen ($N_2$), or hydrogen ($H_2$) is used as an etching gas, to remove a part of the isolation structure 210 covering the top surface of the protective layer 120 and part or all of a part of the isolation structure 210 covering the side wall of the initial bit line trench 130 through etching by using the dry etching process.

When a part of the isolation structure 210 covering the side wall of the initial bit line trench 130 is removed, a part of the isolation structure 210 at the bottom of the initial bit line trench 130 and at the same height as the conductive structure 230 may be retained, to expose a part of the side wall of the initial bit line trench 130 located above the conductive structure 230, such that a formed bit line contact structure 240 can be in direct contact with the base 110; or a part of the isolation structure 210 covering the side wall of the initial bit line trench 130 may be all removed, a part of the isolation structure 210 covering a bottom wall of the initial bit line trench 130 is only retained, and after a part of the isolation structure 210 originally located between the conductive structure 230 and the side wall of the initial bit line trench 130 is removed, a gap is formed between two sides of the conductive structure 230 and the side wall of the initial bit line trench 130.

S380: Form a bit line contact structure, the bit line contact structure covers the conductive structure, and a top surface of the bit line contact structure is lower than a top surface of the active region structure.

S390: Form an insulation structure, the insulation structure covers the bit line contact structure, and a top surface of the insulation structure is flush with the top surface of the protective layer.

As shown in FIG. 37, according to the buried bit line structure formed in this embodiment, the gap is formed between the two sides of the conductive structure and the side wall of the initial bit line trench. A dielectric constant of the air is smaller, and a parasitic capacitance between bit line structures can be reduced by isolating the conductive structure from the base through the air.

According to an exemplary embodiment, this embodiment is a description of the implementation of step S380 of the foregoing embodiment.

The forming a bit line contact structure includes: depositing the bit line contact structure by using a low pressure chemical vapor deposition process, and the bit line contact structure closes an opening of a gap to form an air gap.

Figure 39:
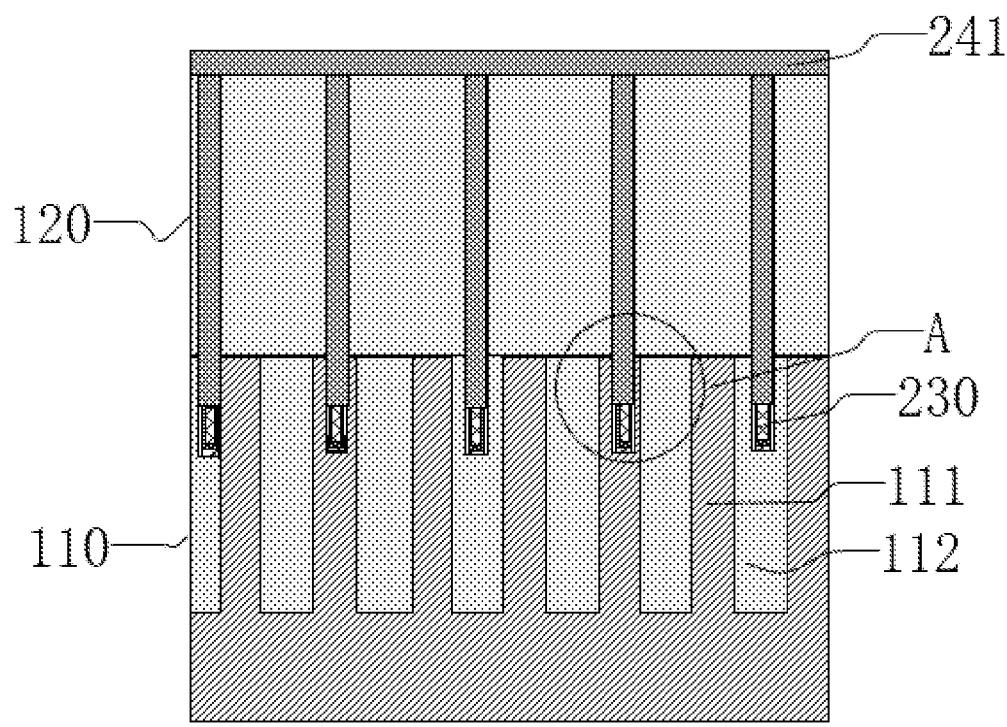
FIG. 39 is a schematic cross-sectional diagram along an A-A section after a polycrystalline silicon layer is deposited in a method of manufacturing a buried bit line structure according to an exemplary embodiment.
Figure 40:
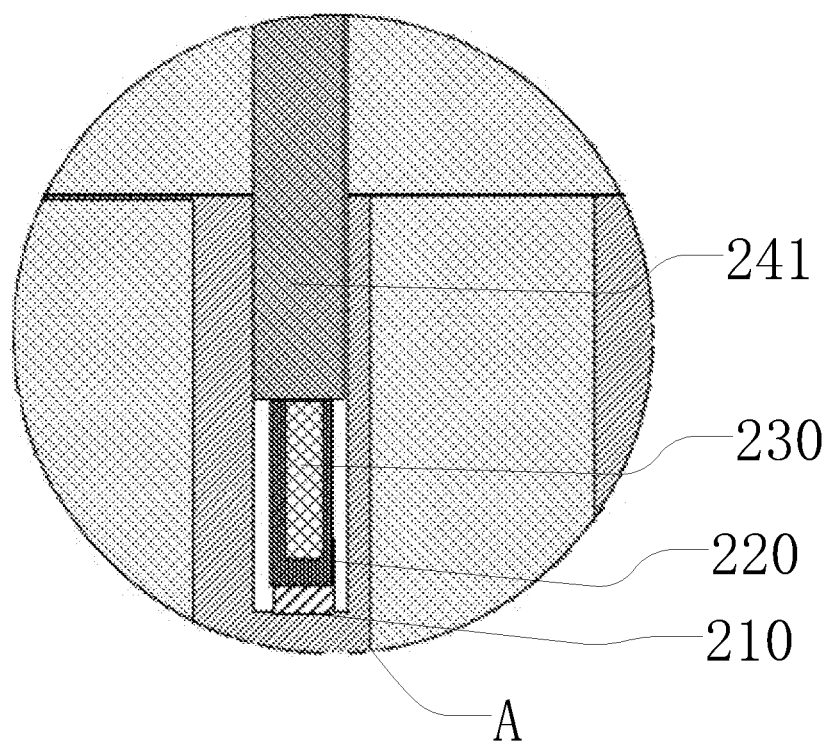
FIG. 40 is a partial enlarged view of an A position in FIG. 39.
Figure 41:
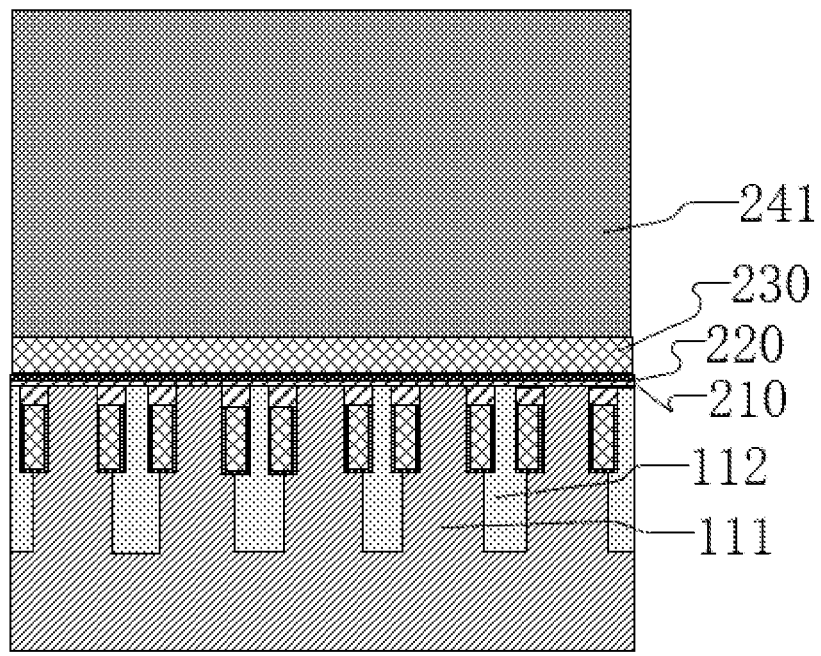
FIG. 41 is a schematic cross-sectional diagram along a B-B section after a polycrystalline silicon layer is deposited in a method of manufacturing a buried bit line structure according to an exemplary embodiment.

FIG. 39 is a schematic cross-sectional diagram along an A-A section after a polycrystalline silicon layer is deposited according to the embodiment (referring to FIG. 15). FIG. 40 is a partial enlarged view of an A position in FIG. 39. FIG. 41 is a schematic cross-sectional diagram along a B-B section after a polycrystalline silicon layer is deposited according to the embodiment (referring to FIG. 15). FIG. 42 is a schematic cross-sectional diagram along an A-A section after a bit line contact structure is formed according to the embodiment (referring to FIG. 15). FIG. 43 is a partial enlarged view of an A position in FIG. 42. FIG. 44 is a schematic cross-sectional diagram along a B-B section after a bit line contact structure is formed according to the embodiment (referring to FIG. 15).

As shown in FIG. 42, FIG. 43, and FIG. 44, referring to FIG. 39, FIG. 40, and FIG. 41, the bit line contact structure 240 is formed. A polycrystalline silicon layer 241 is first deposited by using a low pressure chemical vapor deposition (LPCVD) process. The polycrystalline silicon layer 241 closes an opening of a gap, and fills a part of the initial bit line trench 130 above the conductive structure 230 and cover the top surface of the protective layer 120. A part of the polycrystalline silicon layer 241 is removed by using a dry or wet etching process, and a top surface of a retained part of the polycrystalline silicon layer 241 is lower than the top surface of the active region structure 111.

In this embodiment, in a temperature environment of 480° C. to 520° C., a mixing gas of silane ($SIH_4$) and phosphine ($PH_3$) is used as a reaction gas, to deposit polycrystalline silicon by using the low pressure chemical vapor deposition process, phosphine ($PH_3$) is used as a doping gas doped with the polycrystalline silicon, polycrystalline silicon doped with P is formed by doping P elements thermally decomposed from $PH_3$ with the polycrystalline silicon, and the bit line contact structure 240 is formed by depositing the polycrystalline silicon doped with P in the initial bit line trench 130, such that the bit line contact structure 240 has good conductivity.

Figure 5:
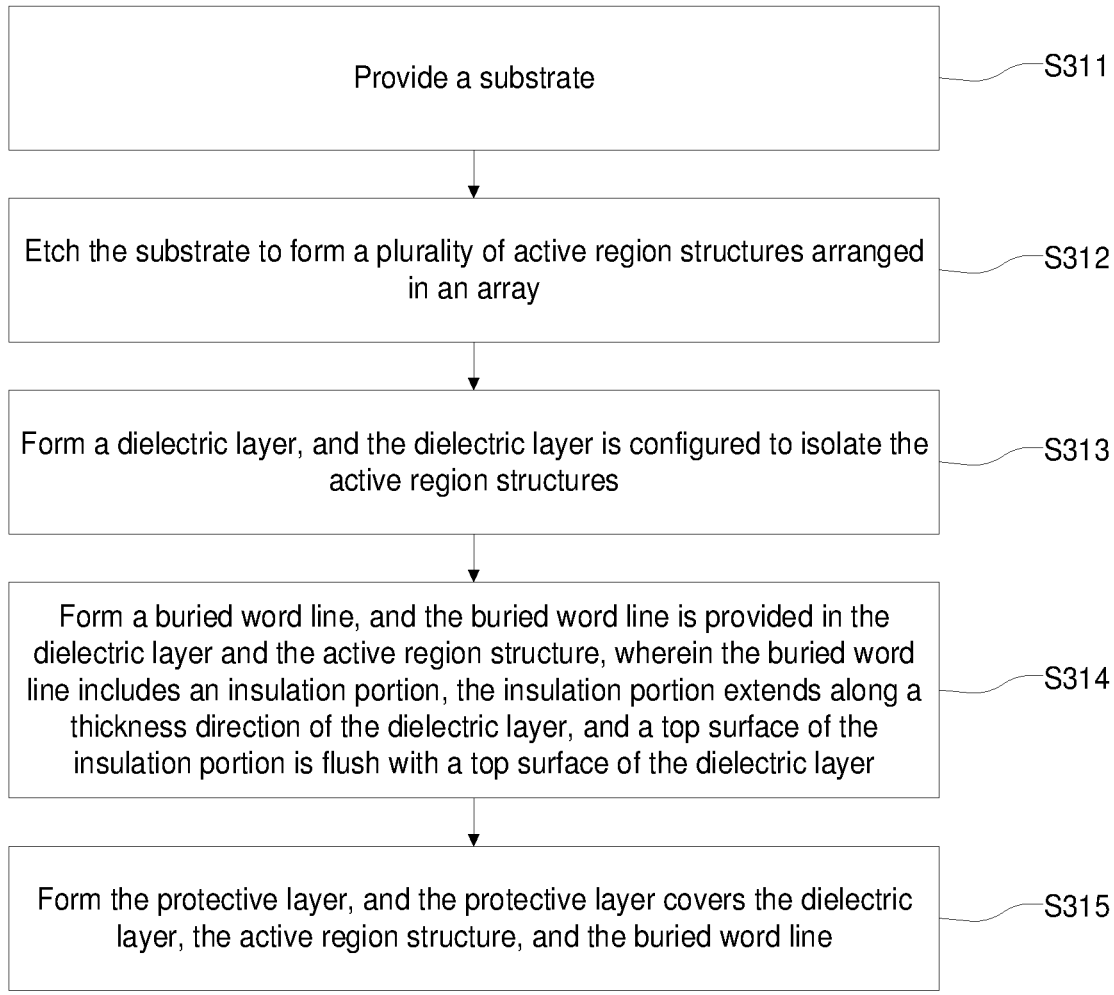
FIG. 5 is a flowchart of providing an initial structure in a method of manufacturing a buried bit line structure according to an exemplary embodiment.

According to an exemplary embodiment, this embodiment is a description of the implementation of step S310 of the foregoing embodiment. As shown in FIG. 5, FIG. 5 is a flowchart of step S310 in a method of manufacturing a buried bit line structure according to the embodiments.

The providing an initial structure includes:

S311: Provide a substrate.

Figure 7:
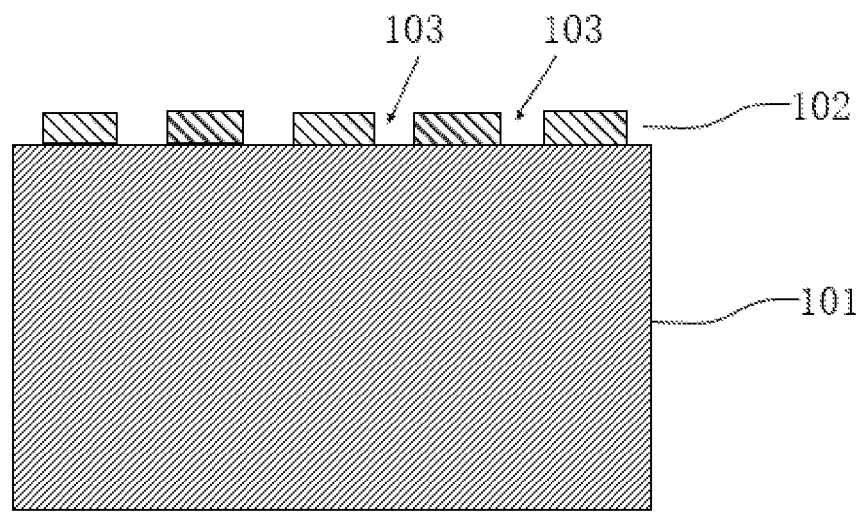
FIG. 7 is a schematic diagram of a substrate provided in a method of manufacturing a buried bit line structure according to an exemplary embodiment.

As shown in FIG. 7, a material of the substrate 101 may be silicon (Si), germanium (Ge), silicon-germanium (GeSi), or silicon carbide (SiC); may also be silicon on insulator (SOI) or germanium on insulator (GOI); or may also be another material, for example, a III-V compound such as gallium arsenide. In this embodiment, the material of the substrate 101 is silicon. The substrate 101 may be doped with certain impurity ions according to a requirement, and the impurity ions may be N-type impurity ions or P-type impurity ions.

S312: Etch the substrate to form a plurality of active region structures arranged in an array.

Figure 8:
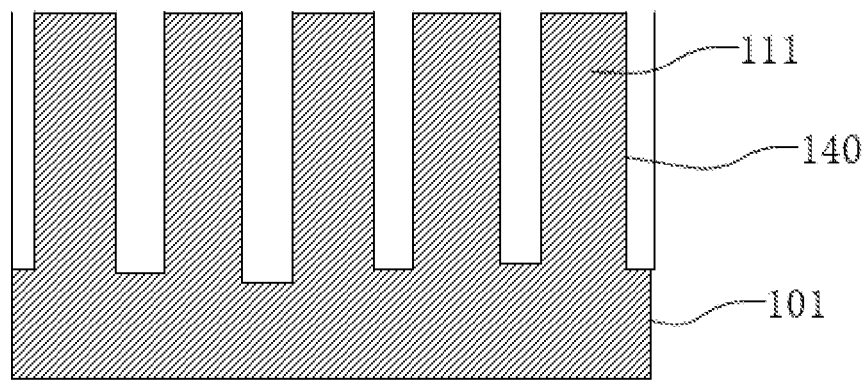
FIG. 8 is a schematic diagram of forming a shallow trench structure on a substrate in a method of manufacturing a buried bit line structure according to an exemplary embodiment.

As shown in FIG. 8, referring to FIG. 7, the first patterned mask 102 is formed on the substrate 101, and the first patterned mask 102 is defined with a first pattern 103; and a part of the substrate 101 is removed according to the first pattern 103 by using a dry or wet etching process to form a shallow trench structure 140 on the substrate 101, so as to form the plurality of active region structures 111 isolated by the shallow trench structure 140 on the substrate 101.

S313: Form a dielectric layer, and the dielectric layer is configured to isolate the active region structures.

Figure 9:
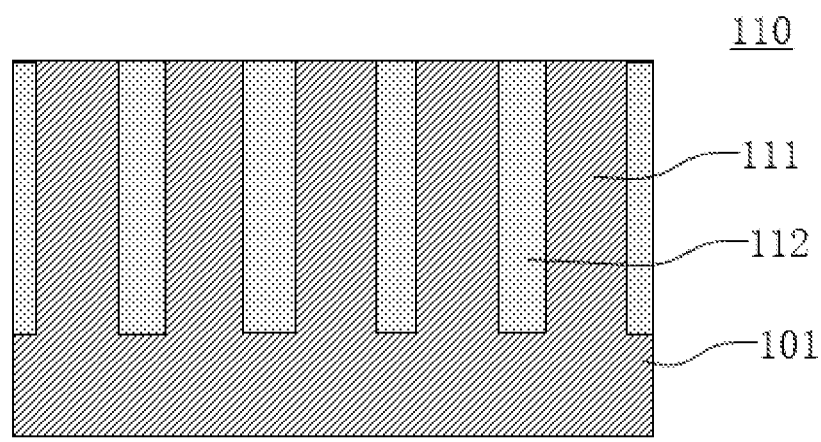
FIG. 9 is a schematic diagram of a base formed by filling a shallow trench structure with a dielectric layer in a method of manufacturing a buried bit line structure according to an exemplary embodiment.

As shown in FIG. 9, referring to FIG. 8, a dielectric layer 112 may be deposited by using an atomic layer deposition (ALD) process, and the dielectric layer 112 fills the shallow trench structure 140, to isolate the active region structures 111 by using the dielectric layer 112 in the shallow trench structure 140, and form the base 110. For example, a material of the dielectric layer 112 may be silicon oxide, silicon nitride, or silicon oxynitride. In this embodiment, the material of the dielectric layer 112 is silicon oxide.

S314: Form a buried word line, and the buried word line is provided in the dielectric layer and the active region structure, wherein the buried word line includes an insulation portion, the insulation portion extends along a thickness direction of the dielectric layer, and a top surface of the insulation portion is flush with a top surface of the dielectric layer.

Figure 10:
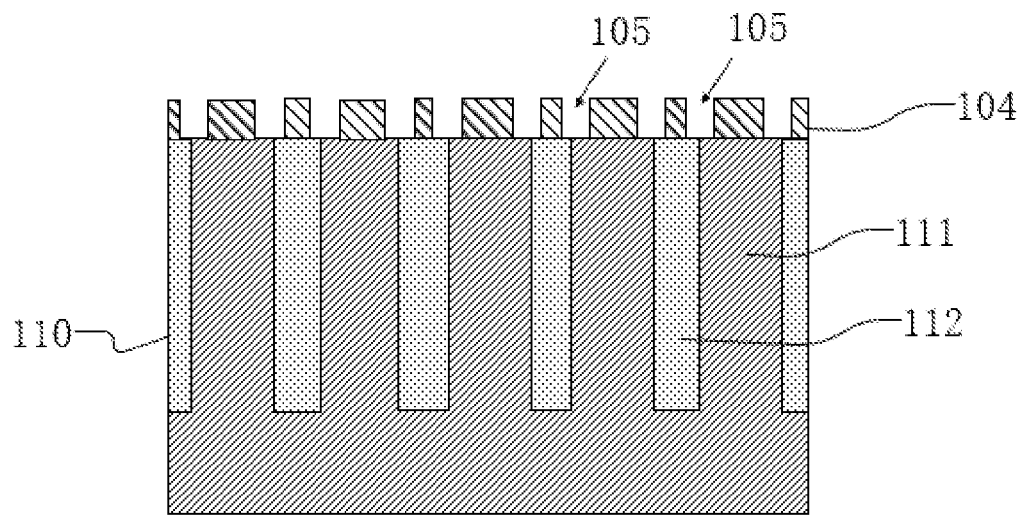
FIG. 10 is a schematic diagram of forming a second patterned mask on a top surface of a base in a method of manufacturing a buried bit line structure according to an exemplary embodiment.
Figure 11:
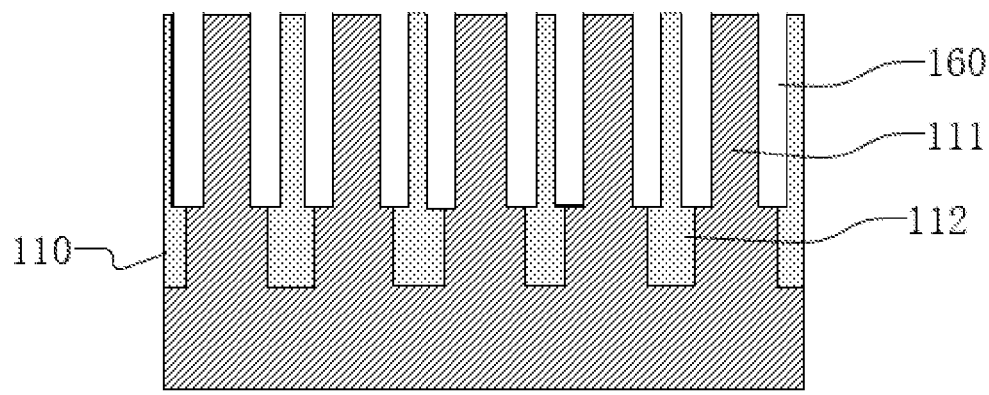
FIG. 11 is a schematic diagram of forming a word line trench in a base in a method of manufacturing a buried bit line structure according to an exemplary embodiment.

As shown in FIG. 10 and FIG. 11, a second patterned mask 104 is first formed on a top surface of the base 110, the second patterned mask 104 is defined with a second pattern 105, and the second pattern 105 exposes a part of the active region structure 111 and a part of a top surface of the dielectric layer 112; and a part of the base 110 is removed according to the second pattern 105 to form a word line trench 160, the word line trench 160 exposes a part of the active region structure 111 and a part of the dielectric layer 112.

Figure 12:
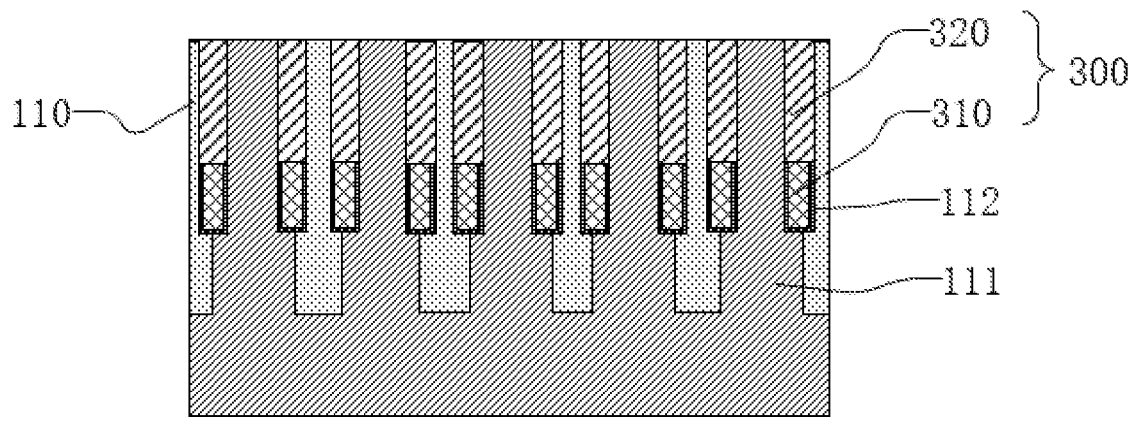
FIG. 12 is a schematic diagram of forming a buried word line in a base in a method of manufacturing a buried bit line structure according to an exemplary embodiment.

As shown in FIG. 12, referring to FIG. 11, a buried word line 300 is formed in the word line trench 160, including depositing a word line metal 310 in the word line trench 160, and depositing an insulation portion 320 in the word line trench 160. The insulation portion 320 covers the word line metal 310, and a top surface of the insulation portion 320 is flush with a top surface of the dielectric layer 112, to expose the top surface of the active region structure 111, such that the buried word line 300 is formed.

S315: Form the protective layer, and the protective layer covers the dielectric layer, the active region structure, and the buried word line.

As shown in FIG. 13, FIG. 14, and FIG. 15, referring to FIG. 12, the protective layer 120 may be deposited by using an atomic layer deposition (ALD) process, and the protective layer 120 and the base 110 form an initial structure 100. For example, a material of the protective layer 120 may be silicon oxide, silicon nitride, or silicon oxynitride. In this embodiment, the material of the protective layer 120 is silicon oxide.

The initial structure provided in this embodiment includes the base and the protective layer located on the base, such that one part of the initial bit line trench formed on the initial structure is located in the base and the other part is located in the protective layer, and a complete bit line structure can be formed in the initial bit line trench without performing etching.

Figure 6:
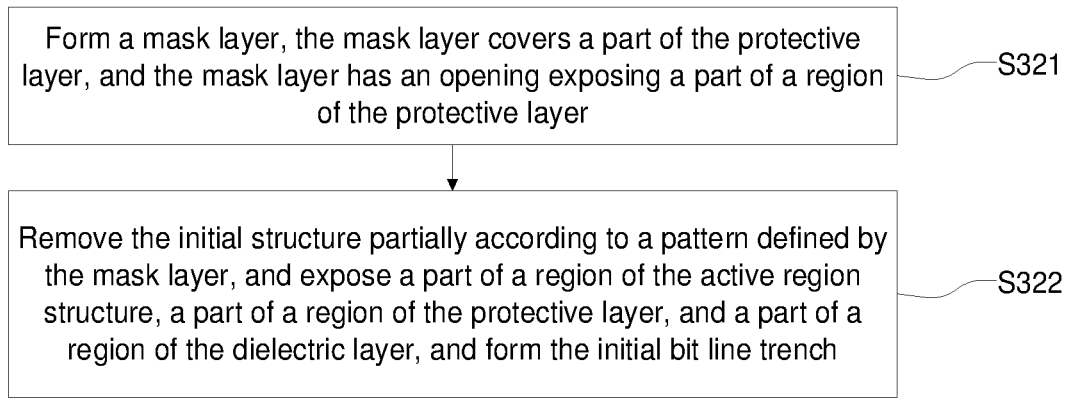
FIG. 6 is a flowchart of forming an initial bit line trench in a method of manufacturing a buried bit line structure according to an exemplary embodiment.

According to an exemplary embodiment, this embodiment is a description of the implementation of step S320 of the foregoing embodiment. As shown in FIG. 6, FIG. 6 is a flowchart of step S320 in a method of manufacturing a buried bit line structure according to the embodiments.

The forming an initial bit line trench includes:

S321: Form a mask layer, the mask layer covers a part of the protective layer, and the mask layer has an opening exposing a part of a region of the protective layer.

Figure 16:
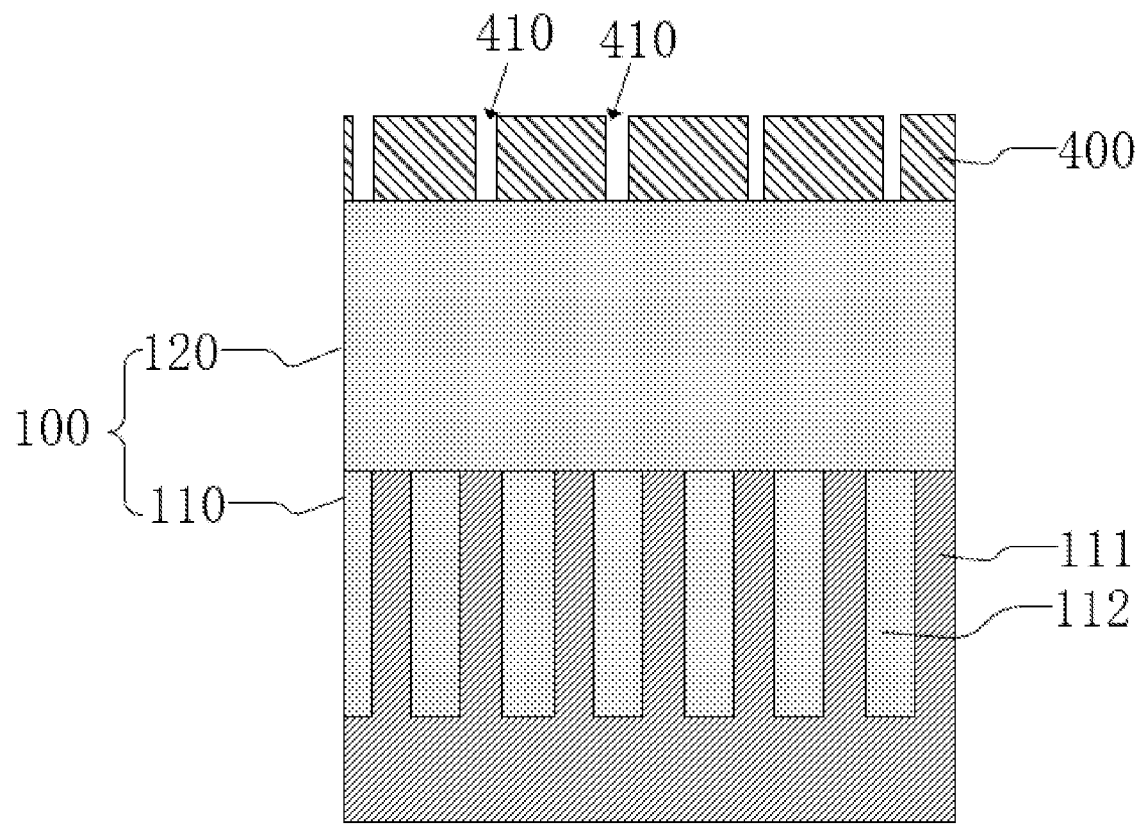
FIG. 16 is a schematic cross-sectional diagram along an A-A section after a mask layer is formed on a top surface of an initial structure in a method of manufacturing a buried bit line structure according to an exemplary embodiment in FIG. 18.
Figure 17:
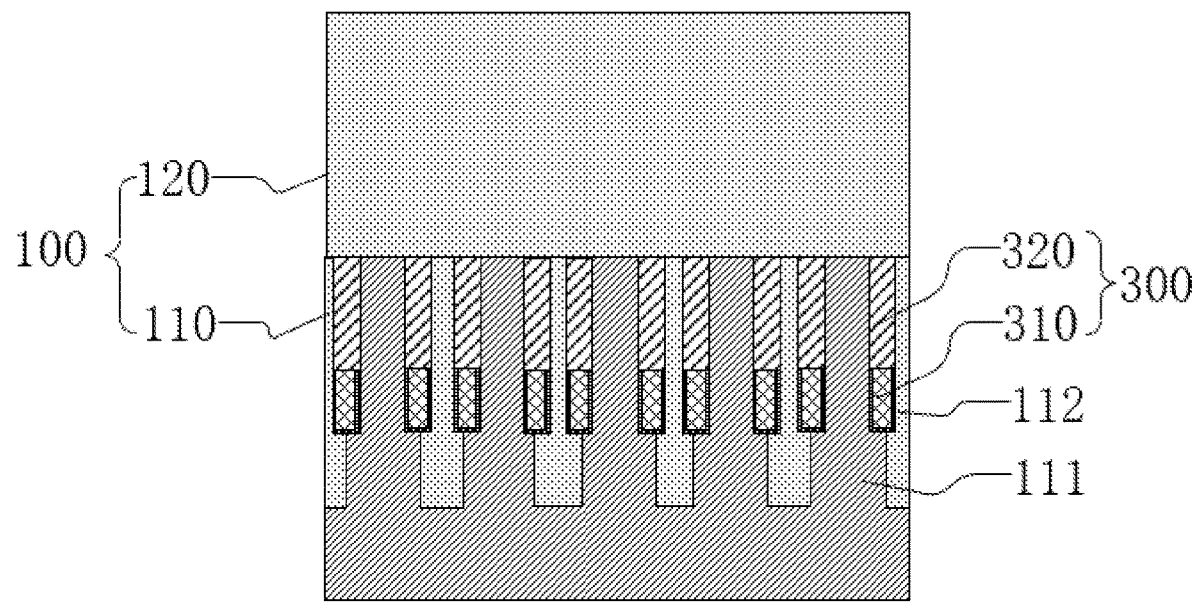
FIG. 17 is a schematic cross-sectional diagram along a B-B section after a mask layer is formed on a top surface of an initial structure in a method of manufacturing a buried bit line structure according to an exemplary embodiment in FIG. 18.
Figure 18:
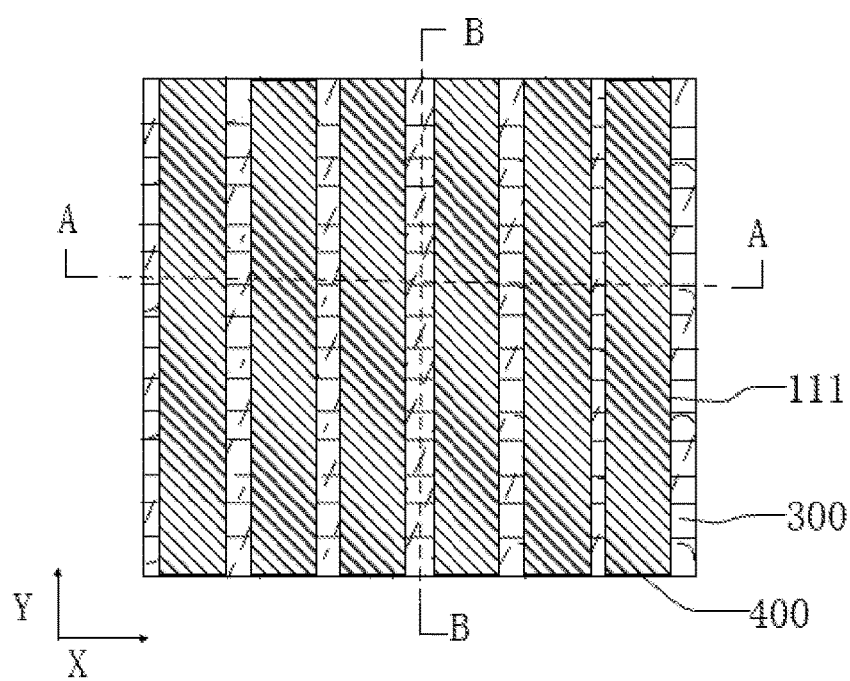
FIG. 18 is a top view after a mask layer is formed on a top surface of an initial structure in a method of manufacturing a buried bit line structure according to an exemplary embodiment.

FIG. 16 is a schematic cross-sectional diagram along an A-A section after a mask layer is formed on a top surface of an initial structure according to the embodiment (referring to FIG. 18). FIG. 17 is a schematic cross-sectional diagram along a B-B section after a mask layer is formed on a top surface of an initial structure according to the embodiment (referring to FIG. 18). FIG. 18 is a top view after a mask layer is formed on a top surface of an initial structure according to the embodiment. As shown in FIG. 16, FIG. 17, and FIG. 18, referring to FIG. 13, FIG. 14, and FIG. 15, a mask layer 400 is formed on the top surface of the protective layer 120, the mask layer 400 is defined with an opening 410, and the opening 410 exposes a part of the protective layer 120.

S322: Remove the initial structure partially according to a pattern defined by the mask layer, and expose a part of a region of the active region structure, a part of a region of the protective layer, and a part of a region of the dielectric layer, and form the initial bit line trench.

As shown in FIG. 19 and FIG. 20, a part of the protective layer 120 corresponding to the opening 410 is removed according to the opening 410 of the mask layer 400, and then a part of the base 110 corresponding to the opening 410 continues to be removed, to form the initial bit line trench 130.

The initial bit line trench formed in this embodiment extends from the top surface of the protective layer into the base, and the initial bit line trench exposes a part of the active region structure and a part of the dielectric layer of the base, such that a formed buried bit line is connected to the active region structure.

A bottom surface of the initial bit line trench 130 is higher than a bottom surface of the insulation portion 320 of the buried word line 300, to avoid contact between the formed bit line structure and the word line metal 310 of the buried word line 300, and avoid mutual interference between the formed bit line structure and the buried word line 300.

In this embodiment, along a depth direction of the initial bit line trench 130, the bottom surface of the initial bit line trench 130 is lower than four-fifths of a height of the insulation portion 320 of the buried word line 300. That is, in this embodiment, the formed buried bit line structure and the word line metal 310 of the buried word line 300 are spaced apart by at least one-fifth of the insulation portion 320, to reduce interference between the buried bit line structure and the buried word line 300.

According to an exemplary embodiment, after the forming an insulation structure in step S390, t further including: removing the protective layer, to expose the insulation structure and the active region structure.

Figure 50:
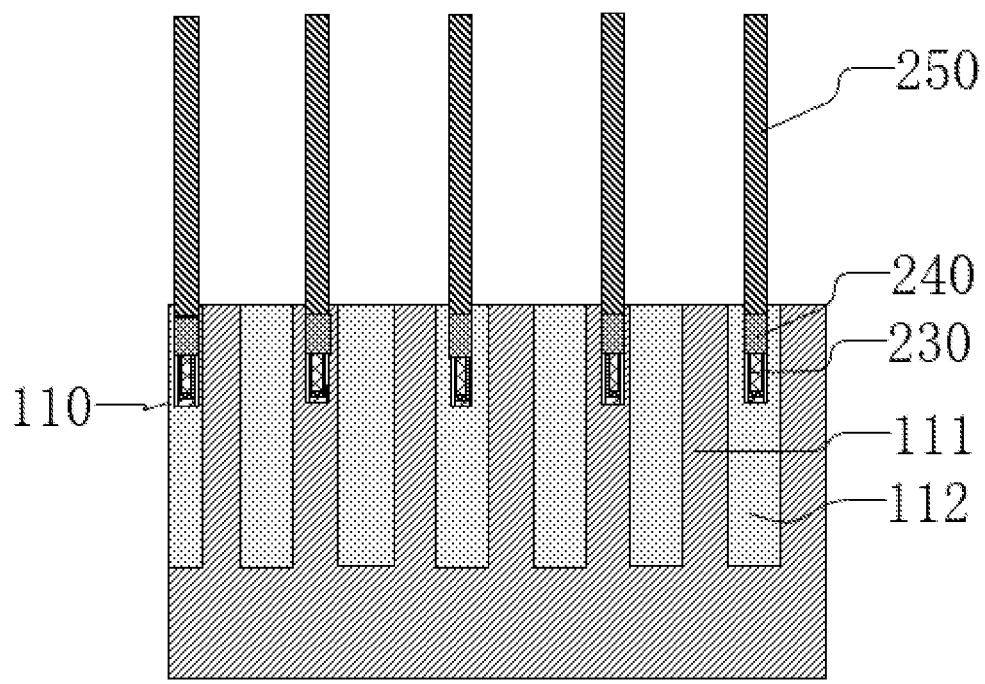
FIG. 50 is a schematic cross-sectional diagram along an A-A section after a protective layer is removed in a method of manufacturing a buried bit line structure according to an exemplary embodiment.
Figure 51:
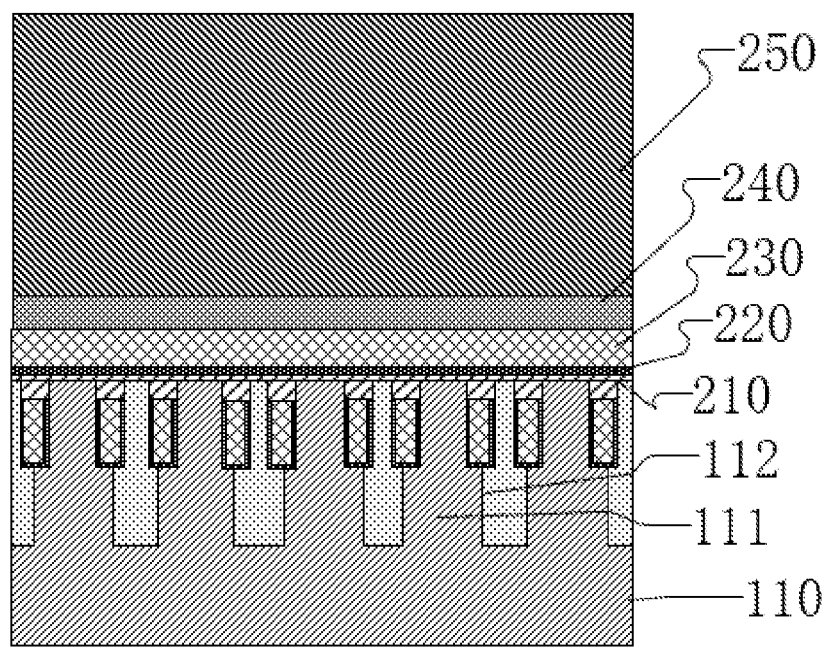
FIG. 51 is a schematic cross-sectional diagram along a B-B section after a protective layer is removed in a method of manufacturing a buried bit line structure according to an exemplary embodiment.

FIG. 50 is a schematic cross-sectional diagram along an A-A section after a protective layer is removed according to the embodiment (referring to FIG. 15). FIG. 51 is a schematic cross-sectional diagram along a B-B section after a protective layer is removed according to the embodiment (referring to FIG. 15). As shown in FIG. 50 and FIG. 51, referring to FIG. 47 and FIG. 49, the protective layer 120 is removed by using a dry or wet etching process, to expose the top surface of the active region structure 111 and the top surface of the dielectric layer 112. The conductive structure 230, the bit line contact structure 240, and the insulation structure 250 form a buried bit line structure, the conductive structure 230 and the bit line contact structure 240 are buried in the base 110, one part of the insulation structure 250 is buried in the base 110, and the other part of the insulation structure 250 extends out of the base 110 to form a linear structure. The bit line structure of the semiconductor structure formed in this embodiment is complete and a structure yield is high.

According to an exemplary embodiment, this exemplary embodiment provides a buried bit line structure. As shown in FIG. 50 and FIG. 51, the buried bit line structure includes: a base 110, a bit line trench provided in the base 110, a conductive structure 230 covering a bottom surface of the bit line trench, a bit line contact structure 240 covering the conductive structure 230, and an insulation structure 250 covering the bit line contact structure 240. Wherein the base 110 includes active region structures 111 and a dielectric layer 112, a top surface of the active region structure 111 is flush with a top surface of the dielectric layer 112, and the bit line trench exposes a part of the dielectric layer 112 and a part of the active region structure 111. The conductive structure 230 is provided at the bottom of the bit line trench and is at a preset distance from a bottom surface of the bit line trench, the bit line contact structure 240 covers the conductive structure and a top surface of the bit line contact structure 240 is lower than the top surface of the active region structure 111, and the insulation structure 250 covers the bit line contact structure 240. The conductive structure 230, the bit line contact structure 240, and the insulation structure 250 form a bit line structure buried and provided in the base 110.

In the buried bit line structure in this embodiment, the conductive structure 230 and the bit line contact structure 240 are buried upside down in the base 110. The bit line structure is complete and a structure yield is high.

According to an exemplary embodiment, most content of the bit line structure in this embodiment is the same as that in the foregoing embodiment, and a difference between this embodiment and the foregoing embodiment lies in that, as shown in FIG. 50 and FIG. 51, a top surface of the insulation structure 250 is higher than the top surface of the active region structure 111.

One part of the insulation structure 250 is buried in the base 110 and the other part extends out of the base 110 to form a linear structure.

According to an exemplary embodiment, most content of the bit line structure in this embodiment is the same as that in the foregoing embodiment, and a difference between this embodiment and the foregoing embodiment lies in that, as shown in FIG. 50 and FIG. 51, the buried bit line structure further includes: an isolation structure 210 covering a part of a bottom surface of the bit line trench and a barrier structure 220 covering a side surface and a bottom surface of the conductive structure 230.

In this embodiment, the isolation structure 210 covers a bottom wall of the bit line trench, the barrier structure 220 covers a side wall and a bottom wall of the conductive structure 230, the conductive structure 230 is provided on the isolation structure 210, and the bottom wall of the conductive structure 230 is separated from the isolation structure 210 by using the barrier structure 220.

According to an exemplary embodiment, most content of the bit line structure in this embodiment is the same as that in the foregoing embodiment, and a difference between this embodiment and the foregoing embodiment lies in that, as shown in FIG. 50 and FIG. 51, an air gap is formed between the barrier structure 220 and the side wall of the bit line trench.

In this embodiment, two sides of the conductive structure 230 are separated from the base 110 by using the air gap. A dielectric constant of the air is small, which can reduce a parasitic capacitance between adjacent bit line structures.

According to an exemplary embodiment, most content of the bit line structure in this embodiment is the same as that in the foregoing embodiment, and a difference between this embodiment and the foregoing embodiment lies in that, referring to FIG. 20, the base further includes the buried word line 300, and the buried word line 300 is provided in the dielectric layer 112 and the active region structure 111.

The buried word line 300 extends along a second direction and the bit line structure extends along a first direction perpendicular to the second direction. Referring to FIG. 15 and FIG. 18, the first direction is a Y direction in FIG. 15 and FIG. 18 and the second direction is an X direction in FIG. 15 and FIG. 18.

Each buried word line 300 intersects with the active region structure 111 and each buried bit line structure intersects with the active region structure 111. Space of the base 110 is fully used, to provide more buried bit line structures and buried word lines 300.

According to an exemplary embodiment, this exemplary embodiment provides a semiconductor structure. The semiconductor structure includes the buried bit line structure in the foregoing embodiments.

The semiconductor structure according to the embodiments of the present disclosure may be included in a memory cell and a memory cell array. A read operation or a write operation is performed through the buried bit line structure in the embodiments of the present disclosure.

The memory cell and the memory cell array may be included in a memory device and the memory device may be used in a dynamic random-access memory (DRAM). However, the memory device may alternatively be applied in a static random-access memory (SRAM), a flash memory (flash EPROM), a ferroelectric random-access memory (FeRAM), a magnetic random-access memory (MRAM), a phase change random-access memory (PRAM), or the like.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the buried bit line structure, the manufacturing method thereof, and the semiconductor structure provided in the embodiments of the present disclosure, the bit line structure is formed in the initial bit line trench, no etching needs to be performed, and even if a size of the bit line structure is small, a bit line collapse problem caused by tilt or collapse of the bit line structure does not occur.

The invention claimed is:

1. A method of manufacturing a buried bit line structure, comprising:
    providing an initial structure, the initial structure comprising a base and a protective layer provided on the base, and the base comprising active region structures and a dielectric layer, and a top surface of the active region structures is flush with a top surface of the dielectric layer;
    forming an initial bit line trench in the initial structure, the initial bit line trench exposing the active region structures;
    forming a conductive structure, the conductive structure being located at a bottom of the initial bit line trench and being at a preset distance from a bottom surface of the initial bit line trench;
    forming a bit line contact structure, the bit line contact structure covering the conductive structure, and a top surface of the bit line contact structure being lower than the top surface of the active region structures; and forming an insulation structure, the insulation structure covering the bit line contact structure, and a top surface of the insulation structure being flush with a top surface of the protective layer.

2. The method of manufacturing a buried bit line structure according to claim 1, further comprising:
forming an initial isolation structure, the initial isolation structure covering a side wall and a bottom wall of the initial bit line trench, and the top surface of the protective layer;
forming an initial barrier structure, the initial barrier structure covering the initial isolation structure; and
forming an initial conductive structure, the initial conductive structure filling the initial bit line trench and covering the initial barrier structure.

3. The method of manufacturing a buried bit line structure according to claim 2, wherein the forming a conductive structure comprises:
etching back the initial conductive structure to form the conductive structure; and
removing a part of the initial barrier structure, a retained part of the initial barrier structure being flush with a top surface of the conductive structure.

4. The method of manufacturing a buried bit line structure according to claim 3, further comprising:
removing a part of the initial isolation structure covering the side wall of the initial bit line trench and the top surface of the protective layer, and retaining a second part of the initial isolation structure located on the bottom surface of the initial bit line trench, to form a gap between the conductive structure and the side wall of the initial bit line trench.

5. The method of manufacturing a buried bit line structure according to claim 4, wherein the forming a bit line contact structure comprises:
depositing the bit line contact structure by a low pressure chemical vapor deposition process, the bit line contact structure sealing an opening of the gap to form an air gap, wherein a top surface of the air gap is defined by the bit line contact structure.

6. The method of manufacturing a buried bit line structure according to claim 1, wherein the providing an initial structure comprises:
providing a substrate;
etching the substrate to form a plurality of the active region structures arranged in an array;
forming the dielectric layer, the dielectric layer being configured to isolate each of the active region structures;
forming a buried word line, the buried word line being provided in the dielectric layer and the active region structures, wherein the buried word line comprises an insulation portion, the insulation portion extends along a thickness direction of the dielectric layer, and a top surface of the insulation portion is flush with the top surface of the dielectric layer; and
forming the protective layer, the protective layer covering the dielectric layer, the active region structures, and the buried word line of the base.

7. The method of manufacturing a buried bit line structure according to claim 6, wherein the forming an initial bit line trench comprises:
forming a mask layer, the mask layer covering a part of the protective layer, and the mask layer comprising an opening exposing a part of a region of the protective layer; and
removing a part of the initial structure according to a pattern defined by the mask layer, and exposing a part of a region of the active region structures, the part of the region of the protective layer, and a part of a region of the dielectric layer, and forming the initial bit line trench.

8. The method of manufacturing a buried bit line structure according to claim 7, wherein the bottom surface of the initial bit line trench is higher than a bottom surface of the insulation portion of the buried word line.

9. The method of manufacturing a buried bit line structure according to claim 8, wherein along a depth direction of the initial bit line trench, the bottom surface of the initial bit line trench is lower than four-fifths of a height of the insulation portion of the buried word line.

10. The method of manufacturing a buried bit line structure according to claim 1, further comprising:
removing the protective layer, to expose the insulation structure and the active region structures.

11. A buried bit line structure, comprising:
a base, the base comprising active region structures and a dielectric layer, and a top surface of the active region structures is flush with a top surface of the dielectric layer;
a bit line trench, provided in the dielectric layer and the active region structures;
a conductive structure, the conductive structure being located at a bottom of the bit line trench and being at a preset distance from a bottom surface of the bit line trench;
a bit line contact structure, the bit line contact structure covering the conductive structure, and a top surface of the bit line contact structure being lower than the top surface of the active region structures; and
an insulation structure, the insulation structure covering the bit line contact structure.

12. The buried bit line structure according to claim 11, wherein a top surface of the insulation structure is higher than the top surface of the active region structures.

13. The buried bit line structure according to claim 12, further comprising:
an isolation structure, the isolation structure covering a part of the bottom surface of the bit line trench and the isolation structure located between the conductive structure and the base; and
a barrier structure, the barrier structure covering a side surface and a bottom surface of the conductive structure.

14. The buried bit line structure according to claim 13, wherein an air gap is formed between the barrier structure and a side wall of the bit line trench.

15. The buried bit line structure according to claim 11, wherein the base further comprises a buried word line, and the buried word line is provided in the dielectric layer and the active region structures.

16. The buried bit line structure according to claim 15, wherein the buried word line extends along a second direction, and the conductive structure extends along a first direction perpendicular to the second direction.

17. A semiconductor structure, wherein the semiconductor structure comprises the buried bit line structure according to claim 11, the base further comprises a buried word line, and the buried word line is provided in the dielectric layer and the active region structures.

18. The buried bit line structure according to claim 17, wherein the buried word line comprises an insulation portion, along a depth direction of the bit line trench, the bottom surface of the bit line trench is lower than four-fifths of a height of the insulation portion of the buried word line.

19. The buried bit line structure according to claim 11, wherein the bit line contact structure covers a part of a side surface of the bit line trench and contacts at least one of the active region structures.

20. The buried bit line structure according to claim 14, wherein a top surface of the air gap is defined by the bit line contact structure.

* * * * *